(12) United States Patent
Kang et al.

(10) Patent No.: US 11,514,988 B2
(45) Date of Patent: Nov. 29, 2022

(54) CONTROLLER AND METHOD OF OPERATING UNDER SUDDEN POWER INTERRUPTION

(71) Applicant: SK hynix Inc., Gyeonggi-do (KR)

(72) Inventors: Ji Yeun Kang, Gyeonggi-do (KR); Ji Hong Kim, Gyeonggi-do (KR); Min Kyung Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/238,784

(22) Filed: Apr. 23, 2021

(65) Prior Publication Data

US 2022/0130465 A1  Apr. 28, 2022

(30) Foreign Application Priority Data

Oct. 22, 2020 (KR) .................. 10-2020-0137788

(51) Int. Cl.
| | |
|---|---|
| *G11C 16/20* | (2006.01) |
| *G11C 16/34* | (2006.01) |
| *G11C 16/16* | (2006.01) |
| *G11C 7/10* | (2006.01) |
| *G11C 16/26* | (2006.01) |
| *G11C 16/10* | (2006.01) |

(52) U.S. Cl.
CPC ............ *G11C 16/20* (2013.01); *G11C 7/1057* (2013.01); *G11C 7/1063* (2013.01); *G11C 7/1084* (2013.01); *G11C 16/102* (2013.01); *G11C 16/16* (2013.01); *G11C 16/26* (2013.01); *G11C 16/3445* (2013.01)

(58) Field of Classification Search
CPC ..... G11C 16/20; G11C 7/1057; G11C 7/1063; G11C 7/1084; G11C 16/102; G11C 16/16; G11C 16/26; G11C 16/3445
See application file for complete search history.

(56) References Cited

U.S. PATENT DOCUMENTS

| | | | | |
|---|---|---|---|---|
| 5,845,313 | A * | 12/1998 | Estakhri ............... | G11C 29/765 |
| | | | | 711/E12.008 |
| 6,978,342 | B1 * | 12/2005 | Estakhri ................. | G06F 3/064 |
| | | | | 711/E12.008 |
| 11,016,839 | B2 * | 5/2021 | Yuan .................... | G06F 11/0793 |
| 11,112,997 | B2 * | 9/2021 | Kim ....................... | G06F 3/0679 |

FOREIGN PATENT DOCUMENTS

| | | |
|---|---|---|
| KR | 10-2017-0120738 A | 11/2017 |
| KR | 10-2020-0011832 A | 2/2020 |

* cited by examiner

*Primary Examiner* — Vanthu T Nguyen
(74) *Attorney, Agent, or Firm* — IP & T Group LLP

(57) ABSTRACT

A method of operating a controller that controls an operation of a semiconductor memory device including a meta area, a normal area, and a state area, includes sensing a turn-on of a memory system including the controller, checking a last state flag among at least one or more state flags stored in the state area, and determining whether to perform a reclaim operation on meta data stored in the meta area based on the checked state flag.

6 Claims, 17 Drawing Sheets

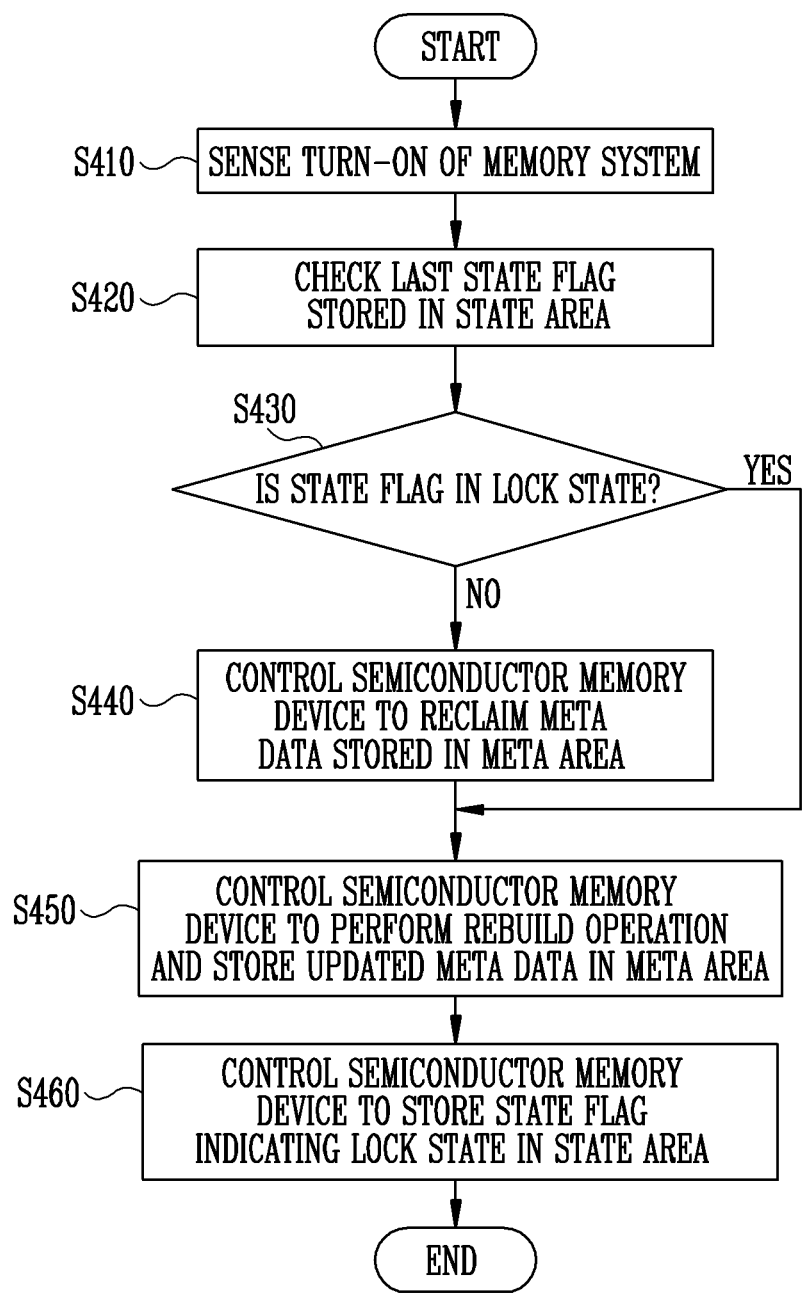

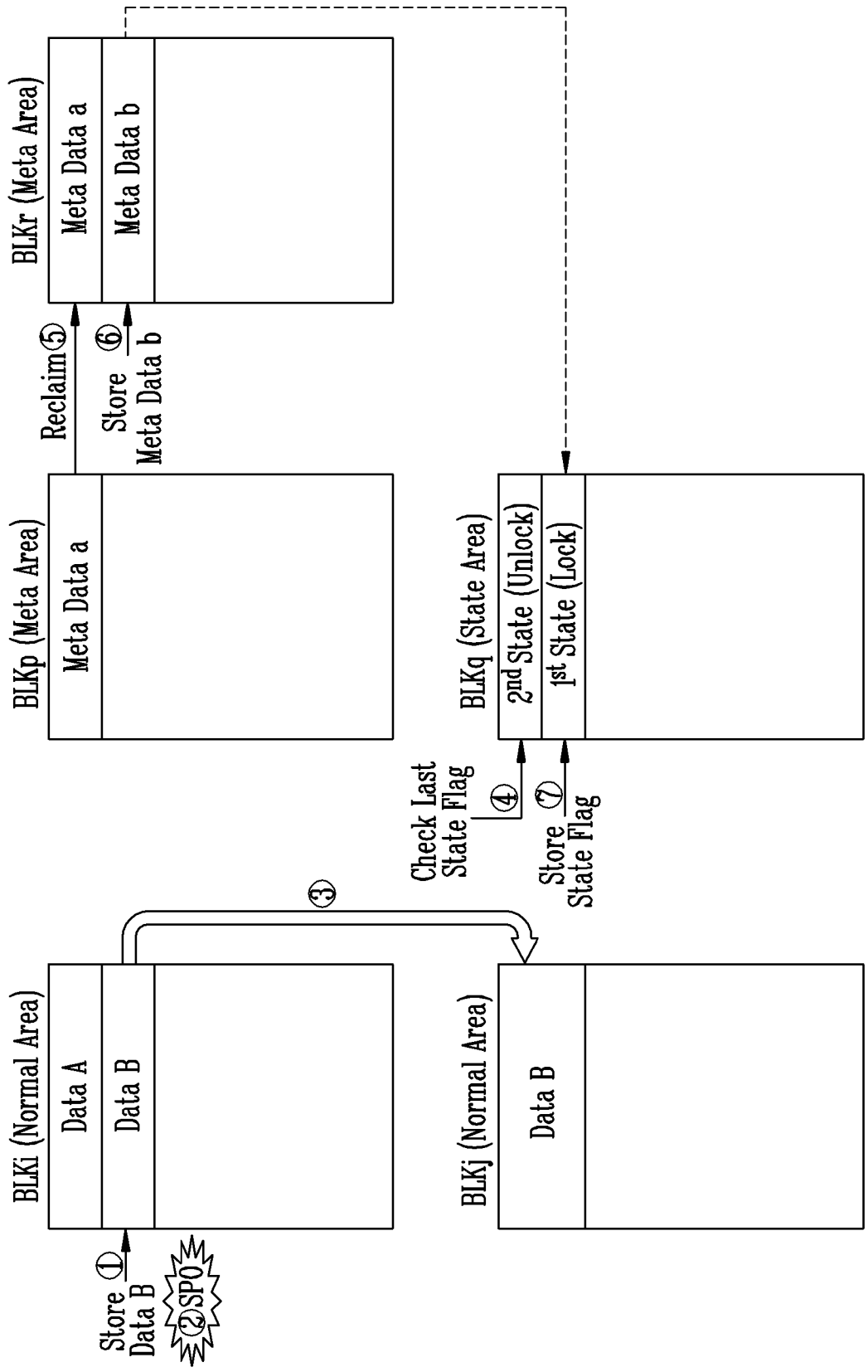

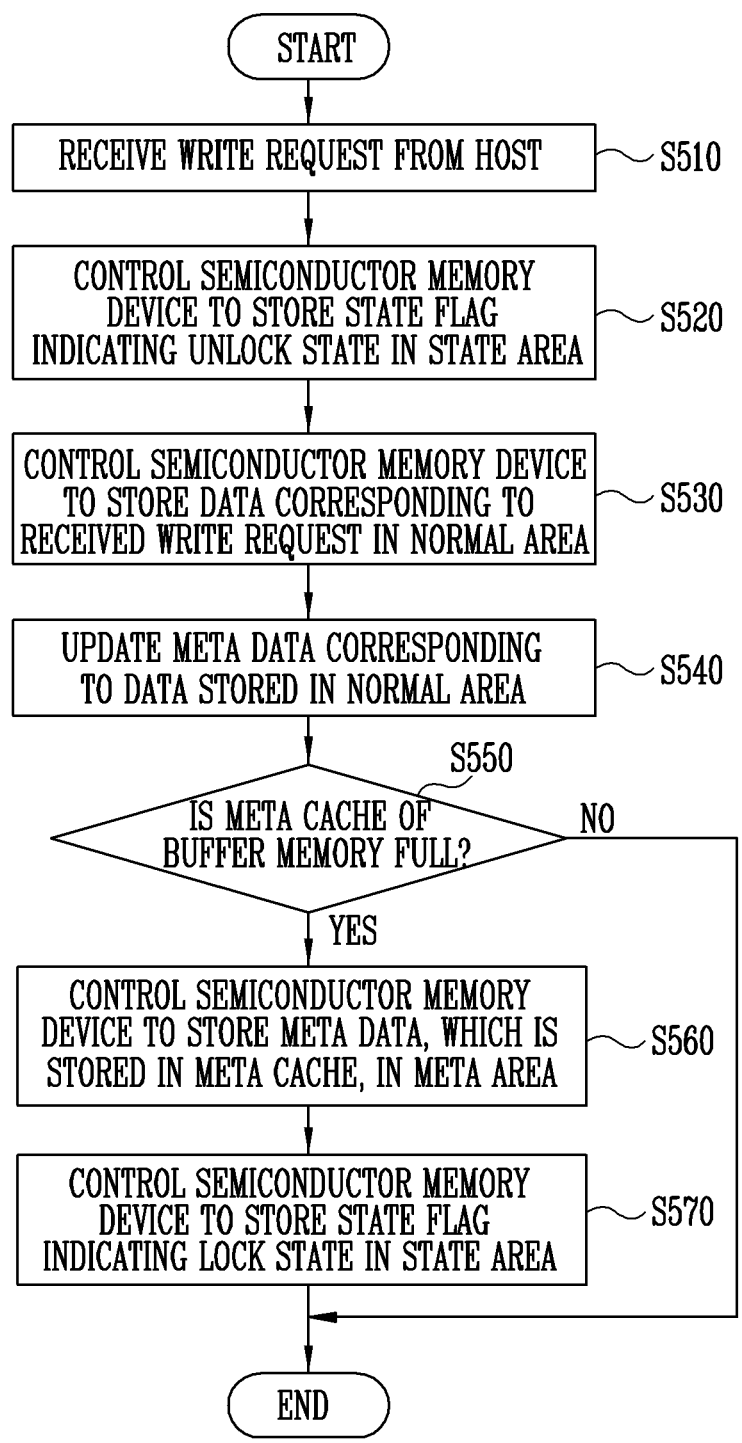

CONTROLLER AND METHOD OF OPERATING UNDER SUDDEN POWER INTERRUPTION

CROSS-REFERENCE TO RELATED APPLICATION

The present Applications claims priority under 35 U.S.C. § 119(a) to Korean patent application number 10-2020-0137788, filed on Oct. 22, 2020, which is incorporated herein by reference in its entirety.

BACKGROUND

Field of Invention

The present disclosure relates to an electronic device, and more particularly, to a controller and a method of operating the same.

Description of Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional semiconductor memory device is a semiconductor memory device designed in order to resolve a limit of integration of a two-dimensional semiconductor memory device, and may include a plurality of memory cells that are vertically stacked on a semiconductor substrate.

A controller may control an operation of the semiconductor memory device.

SUMMARY

An embodiment of the present disclosure provides a controller capable of efficiently using a memory block included in a semiconductor memory device, and a method of operating the controller.

According to an embodiment of the present disclosure, a method of operating a controller that controls an operation of a semiconductor memory device including a meta area, a normal area, and a state area includes sensing a turn-on of a memory system including the controller, checking a last state flag among at least one or more state flags stored in the state area, and determining whether to perform a reclaim operation on meta data stored in the meta area based on the checked state flag.

In an embodiment, each of the at least one or more state flags stored in the state area may indicate at least one of a first state that is a lock state of the meta area or a second state that is an unlock state of the meta area.

In an embodiment, the meta area may include a first memory block in which the first meta data is stored and a second memory block of an erase state. The determining of whether to perform the reclaim operation on the meta data stored in the meta area based on the checked state flag may include controlling the semiconductor memory device to perform the reclaim operation on the first meta data stored in the first memory block in response to a result of the checking indicating that the last state flag indicates the second state.

In an embodiment, the controlling of the semiconductor memory device to perform the reclaim operation on the first meta data stored in the first memory block may include controlling the semiconductor memory device to read the first meta data stored in the first memory block, and controlling the semiconductor memory device to store the read first meta data in the second memory block.

In an embodiment, the determining of whether to perform the reclaim operation on the meta data stored in the meta area based on the checked state may further include after the controlling of the semiconductor memory device to perform the reclaim operation on the first meta data stored in the meta area, updating second meta data stored in a buffer memory inside the controller, controlling the semiconductor memory device to store the updated second meta data in the second memory block, and controlling the semiconductor memory device to store the state flag indicating the first state in the state area.

In an embodiment, the meta area may include a first memory block in which the first meta data is stored and a second memory block of an erase state. The determining of whether to perform the reclaim operation on the meta data stored in the meta area based on the checked state flag may include updating second meta data stored in a buffer memory inside the controller in response to a result of the checking indicating that the last state flag indicates the first state, controlling the semiconductor memory device to store the updated second meta data in the first memory block, and controlling the semiconductor memory device to store the state flag indicating the first state in the state area.

According to another embodiment of the present disclosure, a method of operating a controller that controls an operation of a semiconductor memory device including a meta area, a normal area, and a state area includes receiving a write request and write data corresponding thereto from a host, controlling the semiconductor memory device to store, in the state area, a state flag indicating an unlock state for the meta area, and controlling the semiconductor memory device to store the write data in the normal area.

In an embodiment, the controlling of the semiconductor memory device to store the state flag indicating the unlock state for the meta area in the state area may include generating a program command for programming a first data pattern indicating the unlock state in a selected page of a memory block corresponding to the state area, and transferring the first data pattern and the program command to the semiconductor memory device.

In an embodiment, the method may further include after the controlling of the semiconductor memory device to store the write data in the normal area, updating meta data corresponding to the write data stored in the normal area and storing the meta data in a meta cache of a buffer memory inside the controller, controlling the semiconductor memory device to store, in the meta area, the meta data stored in the meta cache in response to a determination that a state of the meta cache is full of the meta data, and controlling the semiconductor memory device to store, in the state area, a state flag indicating a lock state for the meta area.

In an embodiment, the controlling of the semiconductor memory device to store the state flag indicating the lock state for the meta area may include generating a program command for programming a second data pattern indicating the lock state in a selected page of a memory block corresponding to the state area, and transferring the second data pattern and the program command to the semiconductor memory device.

According to still another embodiment of the present disclosure, a method of operating a controller that controls an operation of a semiconductor memory device including a meta area, a normal area, and a state area includes receiving a write request and write data corresponding thereto from a host, controlling the semiconductor memory device to store the write data in the normal area, updating meta data corresponding to the write data stored in the normal area and storing the meta data in a meta cache of a buffer memory inside the controller, and controlling the semiconductor memory device to store, in the state area, a state flag indicating an unlock state for the meta area in response to a determination that a state of the meta cache is full of the meta data.

In an embodiment, the controlling of the semiconductor memory device to store the state flag indicating the unlock state for the meta area in the state area may include generating a program command for programming a first data pattern indicating the unlock state in a selected page of a memory block corresponding to the state area, and transferring the first data pattern and the program command to the semiconductor memory device.

In an embodiment, the method may further include after the controlling of the semiconductor memory device to store the state flag indicating the unlock state for the meta area in the state area, controlling the semiconductor memory device to store, in the meta area, the meta data stored in the meta cache, and controlling the semiconductor memory device to store, in the state area, a state flag indicating a lock state of the meta area.

In an embodiment, the controlling of the semiconductor memory device to store the state flag indicating the lock state for the meta area in the state area may include generating a program command for programming a second data pattern indicating the lock state in a selected page of a memory block corresponding to the state area, and transferring the second data pattern and the program command to the semiconductor memory device.

According to still another embodiment of the present disclosure, a method of operating a controller that controls an operation of a semiconductor memory device including a first memory block corresponding to a meta area, a second memory block corresponding to a normal area, and a third memory block corresponding to a state area includes generating a first program command for storing, in the first memory block, meta data of a buffer memory inside the controller, checking a program operation state of the semiconductor memory device, and generating a second program command for storing, in the third memory block, a state flag indicating a lock state of the meta area in response to a result of the checking indicating that the first program operation of the meta data is completed.

In an embodiment, the method may further include after the generating of the second program command, sensing a turn-on of a memory system including the controller, checking the state flag stored in the third memory block and indicating the lock state of the meta area, and generating a third program command for storing updated meta data, which is a result of a rebuild operation performed according to the turn-on of the memory system, in the second memory block based on the checked state flag.

According to still another embodiment of the present disclosure, a memory system includes a memory device and a controller. The memory device includes a first storage region, a second storage region and a third storage region. The controller is configured to control the memory device to store, into the third storage region, a first flag while storing a requested data piece and a meta data piece related to the requested data piece respectively into the first storage region and the second storage region. The controller is further configured to control the memory device to store, into the third storage region, a second flag upon completion of the storing of the requested data piece and the related meta data piece. The controller is further configured to perform, during boot-up of the system right after a sudden power interruption on the memory system, a recovery operation on the first storage region, the second storage region and the third storage region. The recovery operation includes a reclaim operation on the second storage region when the first flag is a flag stored last in the third storage region at the sudden power interruption of the memory system, and an operation of storing, into the third storage region, the second flag upon completion of the reclaim operation.

The present technology may provide a controller capable of efficiently using a memory block included in a semiconductor memory device, and a method of operating the controller.

BRIEF DESCRIPTION OF THE DRAWINGS

FIG. 11 is a flowchart illustrating an embodiment of the present disclosure.

FIGS. 12A and 12B are diagrams illustrating a method shown in FIG. 11.

FIG. 13 is a flowchart illustrating an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Figure 1:
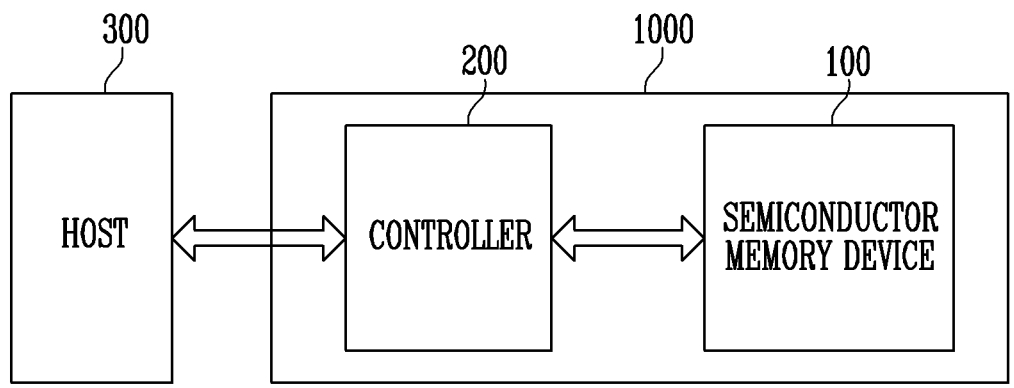
FIG. 1 is a block diagram illustrating a memory system including a controller according to an embodiment of the present disclosure.

FIG. 1 is a block diagram illustrating a memory system including a controller according to an embodiment of the present disclosure.

Referring to FIG. 1, the memory system 1000 includes a semiconductor memory device 100 and the controller 200. In addition, the memory system 1000 communicates with a host 300. The controller 200 controls an overall operation of the semiconductor memory device 100. In addition, the controller 200 controls the operation of the semiconductor memory device 100 based on a command received from the host 300.

Figure 2:
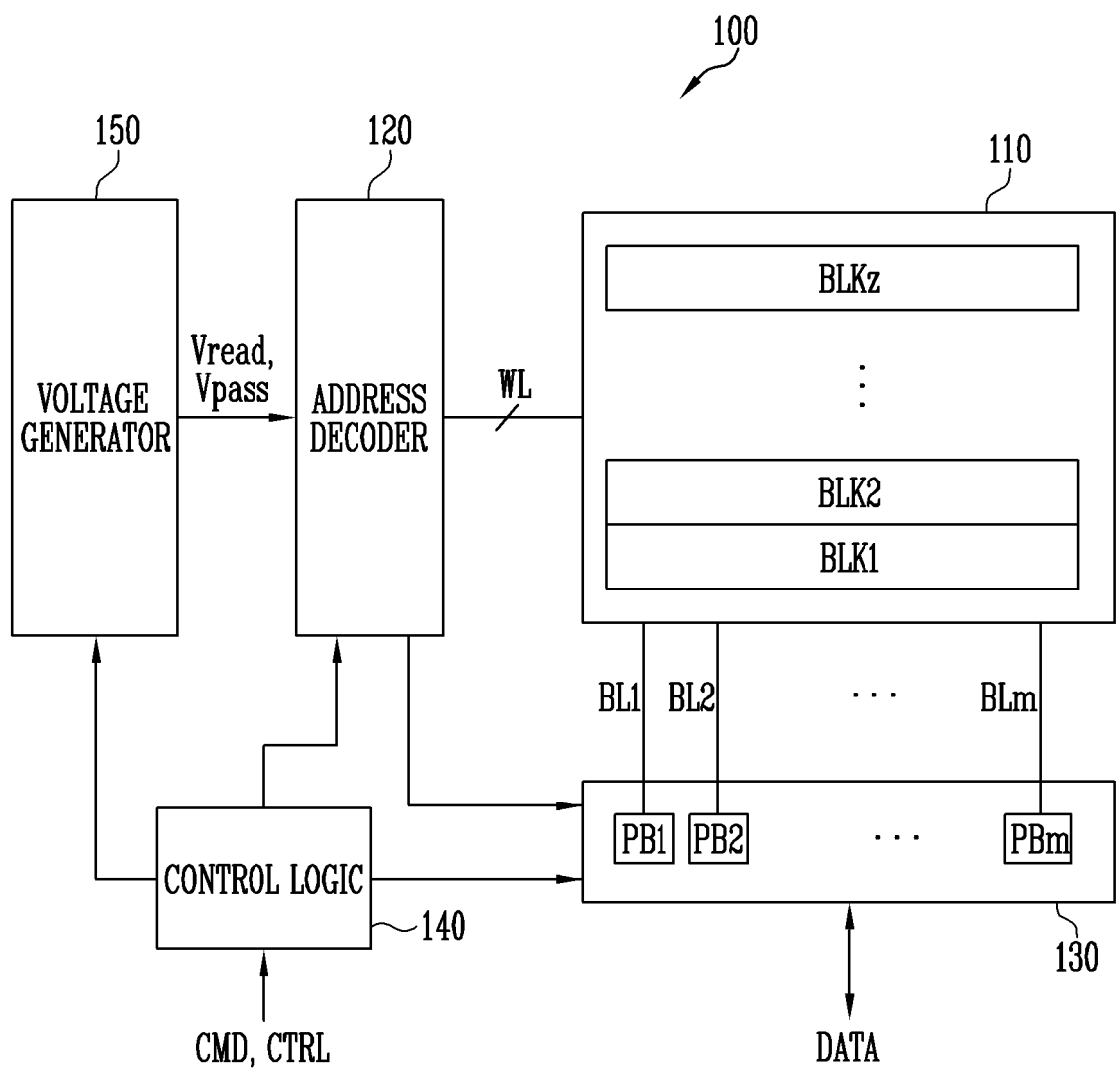
FIG. 2 is a block diagram illustrating a semiconductor memory device of FIG. 1.

FIG. 2 is a block diagram illustrating the semiconductor memory device of FIG. 1.

Referring to FIG. 2, the semiconductor memory device 100 includes a memory cell array 110, an address decoder 120, a read and write circuit 130, a control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured as non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, the control logic 140, and the voltage generator 150 operate as a peripheral circuit that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 is configured to decode a column address of the received addresses. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140. As described above, the voltage generator 150 may include the charge pump, and the charge pump may include the plurality of pumping capacitors described above. A specific configuration of the charge pump included in the voltage generator 150 may be variously designed as necessary.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

Figure 3:
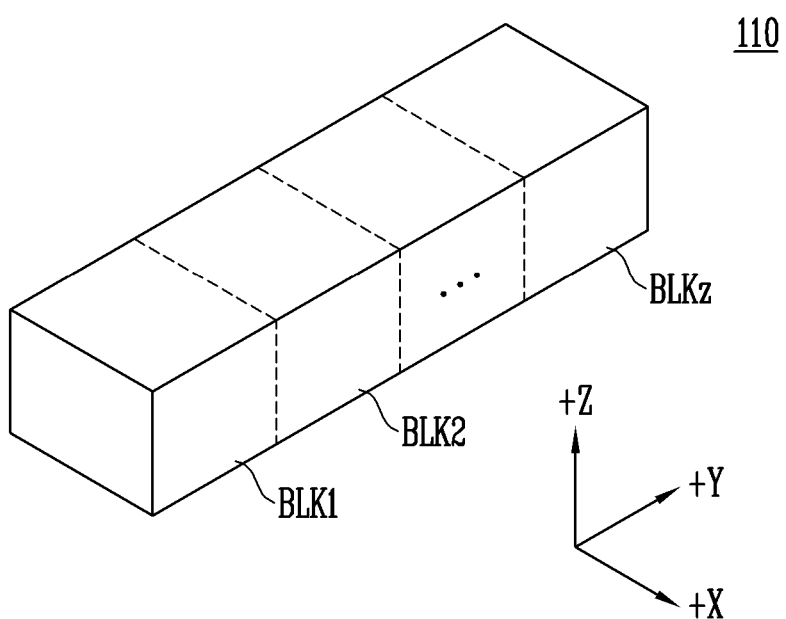
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such a plurality of memory cells are arranged along a +X direction, a +Y direction, and a +Z direction. A structure of each memory block is described in more detail with reference to FIGS. 4 and 5.

Figure 4:
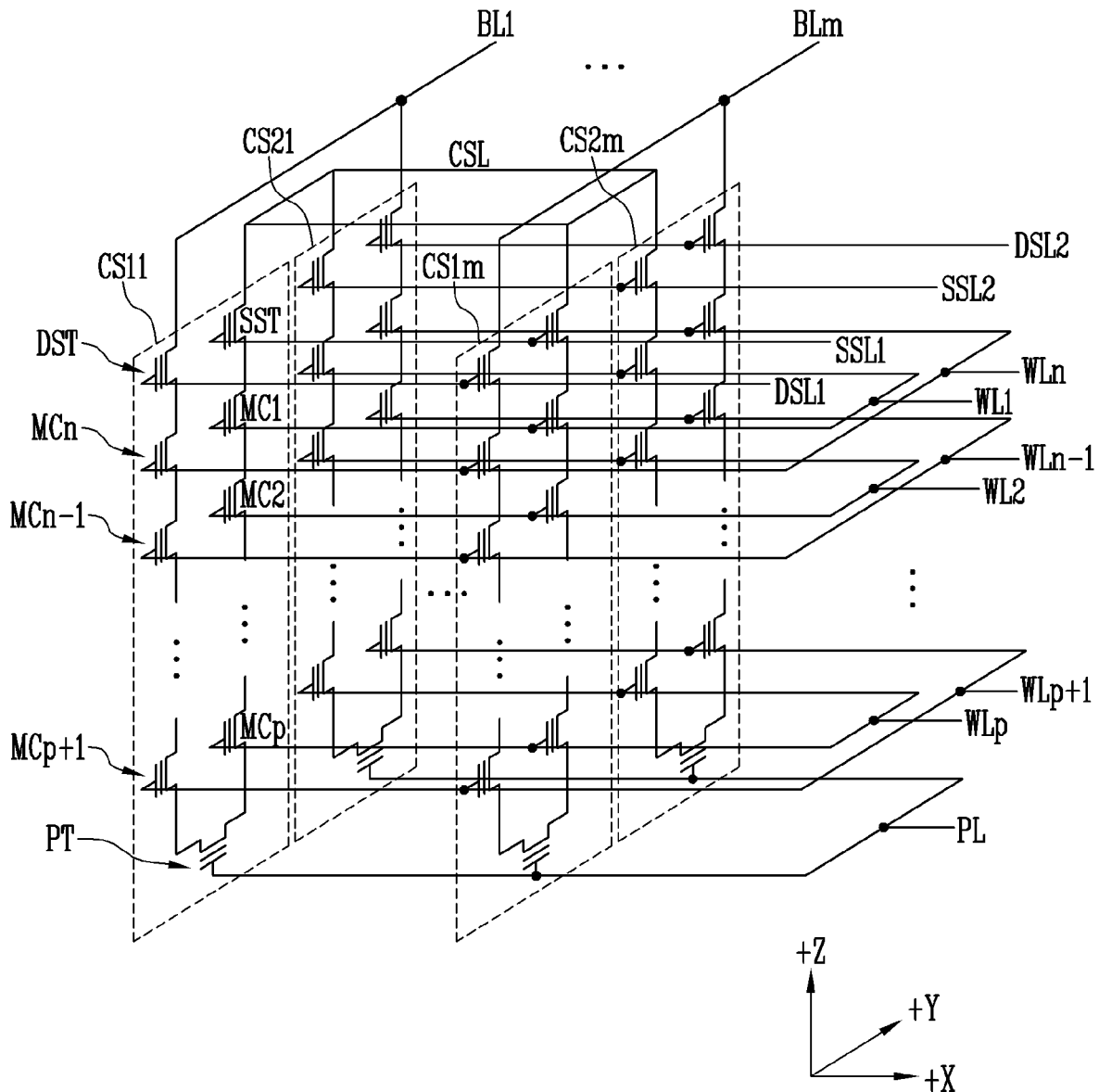
FIG. 4 is a circuit diagram illustrating one memory block BLKa of memory blocks BLK1 to BLKz of FIG. 3.

FIG. 4 is a circuit diagram illustrating one memory block BLKa of the memory blocks BLK1 to BLKz of FIG. 3.

Referring to FIG. 4, the memory block BLKa includes a plurality of cell strings CS11 to CS1*m* and CS21 to CS2*m*. In an embodiment, each of the plurality of cell strings CS11 to CS1*m* and CS21 to CS2*m* may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1*m* of a first row are connected to a first source select line SSL1. The source select transistors of the cell strings CS21 to CS2*m* of a second row are connected to a second source select line SSL2.

In another embodiment, the source select transistors of the cell strings CS11 to CS1*m* and CS21 to CS2*m* may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1*m* of the first row are connected to a first drain select line DSL1. The drain select transistors of the cell strings CS21 to CS2*m* of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1*m* and CS2*m* of the m-th column are connected to the m-th bit line BLm.

The memory cells connected to the same word line in the cell strings arranged in the row direction configure one page. For example, the memory cells connected to the first word line WL1, among the cell strings CS11 to CS1*m* of the first row configure one page. The memory cells connected to the first word line WL1, among the cell strings CS21 to CS2*m* of the second row configure another page. The cell strings arranged in one row direction may be selected by selecting one of the drain select lines DSL1 and DSL2. One page of the selected cell strings may be selected by selecting one of the word lines WL1 to WLn.

In another embodiment, even bit lines and odd bit lines may be provided instead of the first to m-th bit lines BL1 to BLm. In addition, even-numbered cell strings among the cell strings CS11 to CS1*m* or CS21 to CS2*m* arranged in the row direction may be connected to the even bit lines, and odd-numbered cell strings among the cell strings CS11 to CS1*m* or CS21 to CS2*m* arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
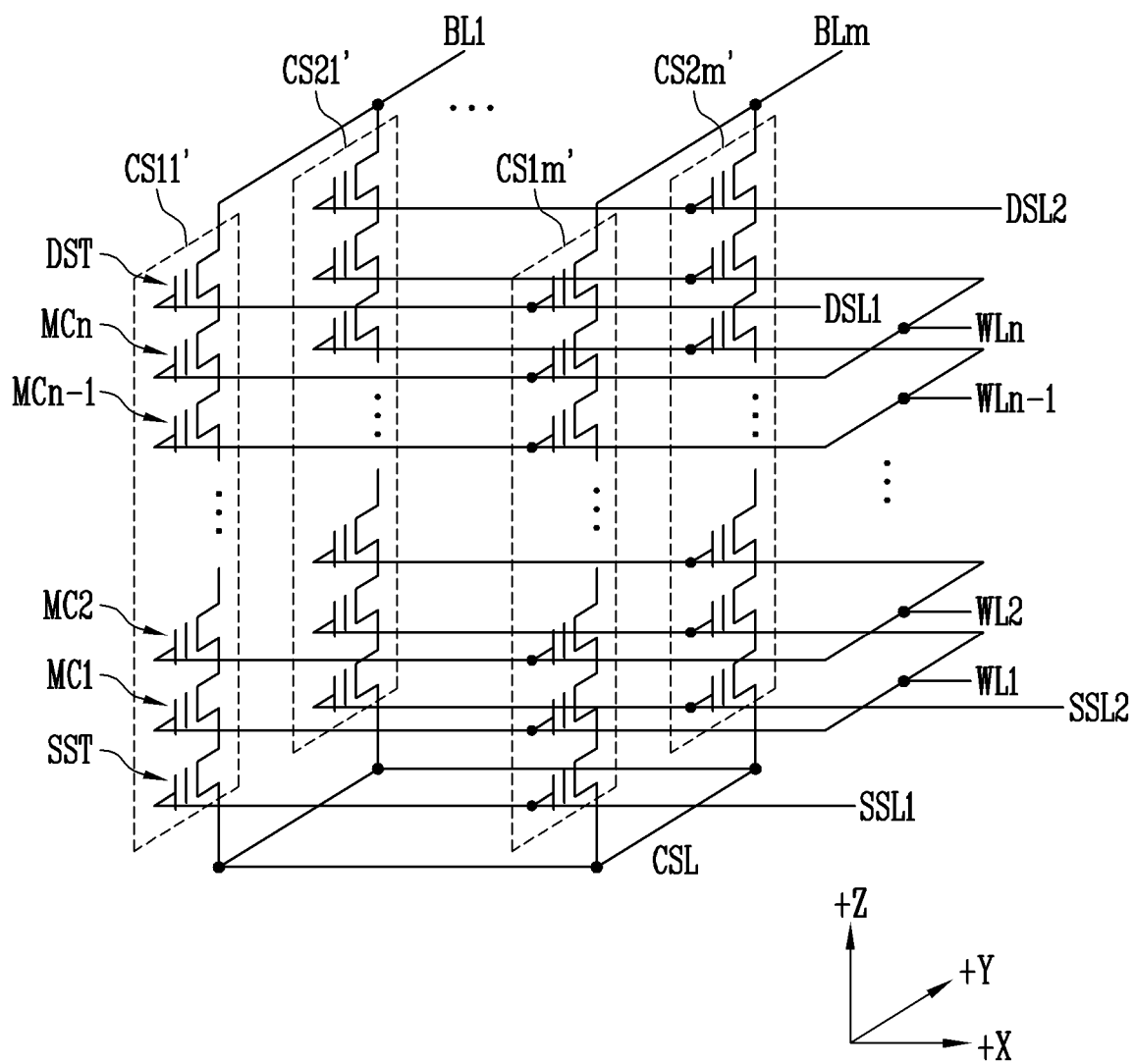
FIG. 5 is a circuit diagram illustrating another embodiment of one memory block BLKb of the memory blocks BLK1 to BLKz of FIG. 3.

FIG. 5 is a circuit diagram illustrating another embodiment of one memory block BLKb of the memory blocks BLK1 to BLKz of FIG. 3.

Referring to FIG. 5, the memory block BLKb includes a plurality of cell strings CS11' to CS1$m$' and CS21' to CS2$m$'. Each of the plurality of cell strings CS11' to CS1$m$' and CS21' to CS2$m$' extends along a +Z direction. Each of the plurality of cell strings CS11' to CS1$m$' and CS21' to CS2$m$' includes at least one source select transistor SST, first to n-th memory cells MC1 to MCn, and at least one drain select transistor DST stacked on a substrate (not shown) under the memory block BLK1.

The source select transistor SST of each cell string is connected between a common source line CSL and memory cells MC1 to MCn. The source select transistors of the cell strings arranged in the same row are connected to the same source select line. The source select transistors of the cell strings CS11' to CS1$m$' arranged in a first row are connected to a first source select line SSL1. The source select transistors of the cell strings CS21' to CS2$m$' arranged in a second row are connected to a second source select line SSL2. In another embodiment, the source select transistors of the cell strings CS11' to CS1$m$' and CS21' to CS2$m$' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1$m$' of a first row are connected to a first drain select line DSL1. The drain select transistors of the cell strings CS21' to CS2$m$' of a second row are connected to a second drain select line DSL2.

As a result, the memory block BLKb of FIG. 5 has an equivalent circuit similar to that of the memory block BLKa of FIG. 4 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1$m$' or CS21' to CS2$m$' arranged in the row direction may be connected to even bit lines, and odd-numbered cell strings among the cell strings CS11' to CS1$m$' or CS21' to CS2$m$' arranged in the row direction may be connected to odd bit lines, respectively.

In an embodiment, at least one of the first to n-th memory cells MC1 to MCn may be used as a dummy memory cell.

For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
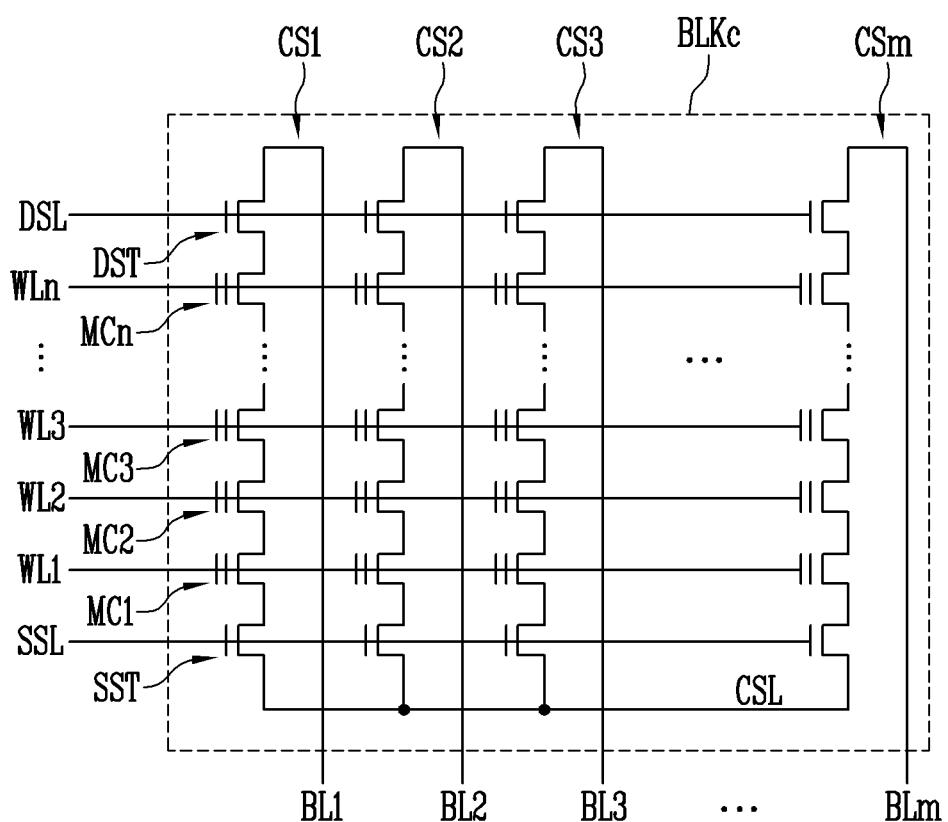
FIG. 6 is a circuit diagram illustrating an embodiment of one memory block BLKc of the memory blocks BLK1 to BLKz included in a memory cell array 110 of FIG. 2.

FIG. 6 is a circuit diagram illustrating an embodiment of one memory block BLKc of the memory blocks BLK1 to BLKz included in the memory cell array 110 of FIG. 2.

Referring to FIG. 6, the memory block BKLc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

Figure 7:
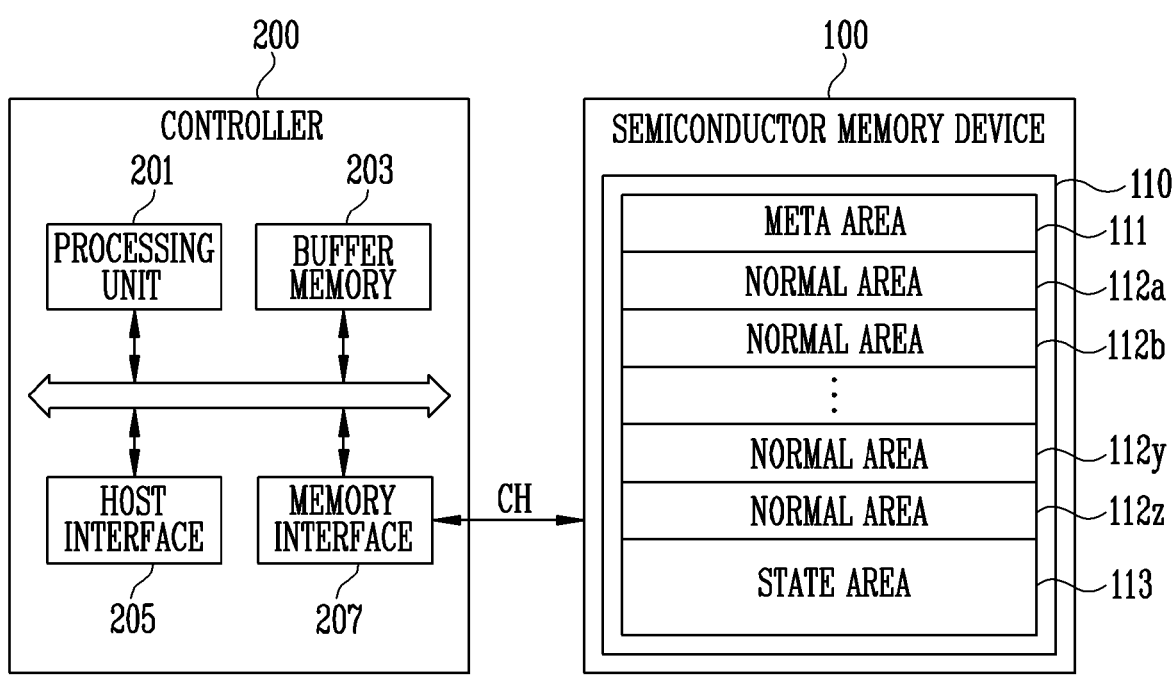
FIG. 7 is a block diagram illustrating a controller 200 and a memory system 1000 including the controller 200 according to an embodiment of the present disclosure.

FIG. 7 is a block diagram illustrating a controller 200 and a memory system 1000 including the controller 200 according to an embodiment of the present disclosure.

Referring to FIG. 7, the memory system 1000 includes the semiconductor memory device 100 and the controller 200. The semiconductor memory device 100 may be the semiconductor memory device described with reference to FIG. 2. The controller 200 corresponds to the controller 200 of FIG. 1. Hereinafter, a repetitive description is omitted.

The semiconductor memory device 100 may include the memory cell array 110. The memory cell array 110 of the semiconductor memory device 100 may include a meta area 111, a plurality of normal areas 112a to 112z, and a state area 113. In FIG. 7, a configuration other than the memory cell array 110 of the semiconductor memory device 100 is omitted.

Meta data of data stored in the normal areas 112a to 112z may be stored in the meta area 111. In an embodiment, the meta data may be data necessary for driving firmware. For example, the meta data may include data generated and used by the controller 200 such as logical address-physical address mapping data or map scan information of data stored in the normal areas 112a to 112z.

User data received from the host may be stored in the normal areas 112a to 112z. Meanwhile, a state flag indicating a state of the meta data stored in the meta area 111 may be stored in the state area 113.

The controller 200 may include a processing unit 201, a buffer memory 203, a host interface 205, and a memory interface 207. The processing unit 201 may be configured of a micro control unit (MCU) and a central processing unit (CPU). The processing unit 201 may process a request transmitted from the host. In order to process the received request, the processing unit 201 may drive an instruction or an algorithm of a code form, that is, firmware, and may control internal functional blocks and the semiconductor memory device 100.

The host interface 205 may interface the host and the memory system 1000. The buffer memory 203 may be configured of a random access memory such as a dynamic random access memory (DRAM) or a static random access memory (SRAM). The buffer memory 203 may temporarily store program data received from the host or read data received from the semiconductor memory device 100. The buffer memory 203 may store data necessary for driving the firmware, for example, the meta data. To this end, the meta data stored in the meta area 111 of the semiconductor memory device 100 may be read and stored in the buffer memory 203. In an embodiment, the buffer memory 203 may operate as an operation memory (working memory) of the processing unit 201.

The memory interface 207 may control the semiconductor memory device 100 under control of the processing unit 201. The memory interface 207 may generate a command, an address, a control signal, and the like for controlling the semiconductor memory device 100 and transfer the command, the address, the control signal, and the like to the semiconductor memory device 100 through a channel CH. In addition, the memory interface 207 may receive data from the semiconductor memory device 100 through the channel CH.

The meta area 111, the plurality of normal areas 112a to 112z, and the state area 113 shown in FIG. 7 may be a data storage area of an arbitrary size. In an embodiment, each of the meta area 111, the plurality of normal areas 112a to 112z, and the state area 113 may correspond to a memory block. That is, the meta area 111 may be the memory block in which the meta data is stored. Each of the normal areas 112a to 112z may be memory blocks in which the user data is stored. The state area 113 may be a memory block in which the state flag is stored.

According to the controller 200 according to an embodiment of the present disclosure, when the meta data is stored in the meta area 111, the semiconductor memory device 100 is controlled to store in the state area 113 a first state flag indicating a lock state of the meta area 111. When receiving a write request from the host, the controller 200 controls the semiconductor memory device 100 to store in the state area 113 a second state flag indicating an unlock state of the meta area 111, and then start a storage operation of data corresponding to the write request. In addition, when the memory system is turned on, the controller 200 checks the last state flag stored in the state area 113 and determines whether to perform a reclaim operation of the meta data stored in the meta area 111 based on the last state flag.

When the last state flag stored in the state area 113 is the first state flag indicating the lock state of the meta area 111, this means a sudden power cut, that is, sudden power off (SPO) does not occur while programming the meta data in the meta area 111. That is, it means that all meta data of the meta area 111 are normally stored. Therefore, in this case, a reclaim operation is not required to be performed on the meta data stored in the meta area 111.

When the last state flag stored in the state area 113 is the second state flag indicating the unlock state of the meta area 111, this means there exists a possibility that the sudden power cut, that is, the SPO occurs while programming the meta data in the meta area 111. That is, it means that there exists a possibility that some meta data of the meta area 111 are not normally stored. Therefore, in this case, the reclaim operation is required to be performed on the meta data stored in the meta area 111.

Therefore, since the controller 200 according to an embodiment of the present disclosure determines whether to perform the reclaim operation of the meta data stored in the meta area 111 based on the last state flag stored last in the state area 113 when the SPO occurs, the controller 200 may control the semiconductor memory device 100 to perform the reclaim operation only when the reclaim operation is absolutely required. Therefore, a life of memory cells included in the meta area 111 may be maximized by minimizing an unnecessary reclaim operation. Thus, the memory blocks included in the semiconductor memory device 100 may be efficiently used.

Figure 8:
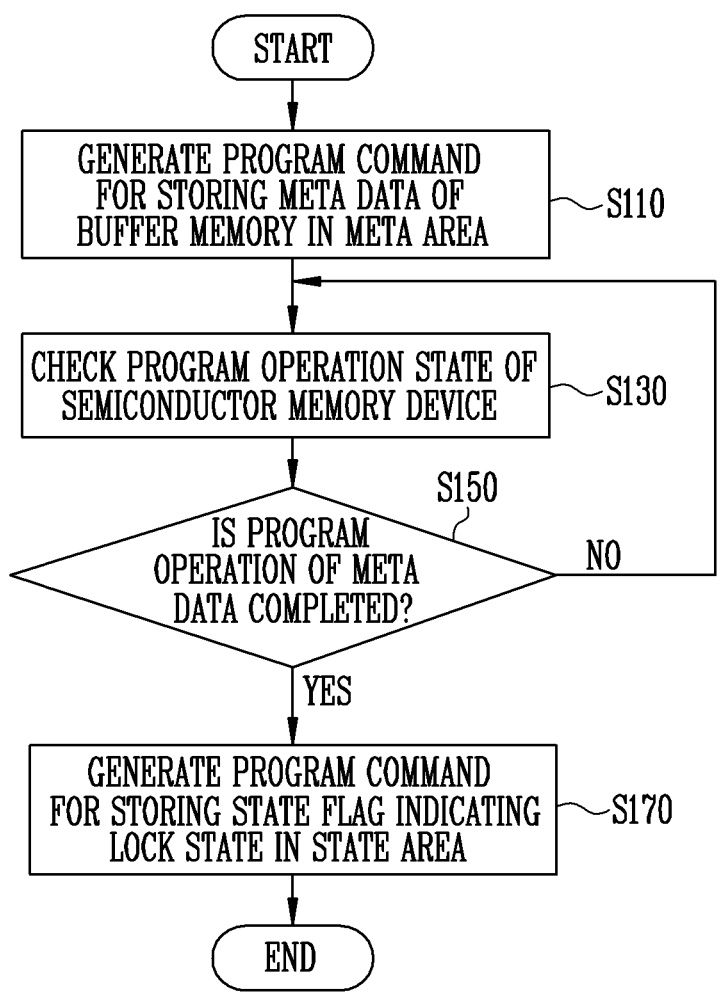
FIG. 8 is a flowchart illustrating a method of operating the controller 200 according to an embodiment of the present disclosure.

FIG. 8 is a flowchart illustrating a method of operating the controller 200 according to an embodiment of the present disclosure. More specifically, FIG. 8 is a flowchart illustrating an embodiment in which the state flag indicating the lock state is stored in the state area 113.

Referring to FIG. 8, the method of operating the controller 200 according to an embodiment of the present disclosure includes generating a program command for storing the meta data of the buffer memory 203 in the meta area 111 (S110), checking a program operation state of the semiconductor memory device 100 (S130), determining whether a program operation of the meta data is completed (S150), and when the program operation of the meta data is completed (S150: Yes), generating a program command for storing the state flag indicating the lock state in the state area 113 of the semiconductor memory device 100 (S170).

In operation S110, the controller 200 may generate the program command for storing the meta data, which is stored in the buffer memory 203, in the meta area 111 of the semiconductor memory device 100. The generated program command is transferred to the semiconductor memory device 100 together with meta data stored in the buffer memory 203. The semiconductor memory device 100 may program the received meta data in the meta area 111 in response to a received program command.

Thereafter, the controller 200 may check the program operation state of the semiconductor memory device 100 (S130). Since a time is required for the semiconductor memory device 100 to program the meta data, the controller 200 may periodically check whether the semiconductor memory device 100 completes the program operation of the meta data. When the program operation of the meta data is not completed as a result of the determination of operation S150 (S150: No), the controller 200 may check the program operation state of the semiconductor memory device 100 again after a predetermined time (S130).

When the semiconductor memory device 100 completes the program operation of the meta data (S150: Yes), the controller 200 generates the program command for storing the state flag indicating the lock state of the meta area 111 in the state area 113 (S170). The semiconductor memory device 100 may program the state flag indicating the lock state in the state area 113 in response to the program command generated in operation S170.

After the meta data is programmed in the meta area 111, when another write request is not received from the host 300, the meta data may not be updated, and thus a program operation on the meta area 111 is also not performed. Therefore, even though the SPO occurs after the meta data is programmed in the meta area 111 and before another write request is received from the host 300, the meta data of the meta area 111 is wholly maintained. That is, it is guaranteed that the meta data is completely programmed in the meta area 111, regardless of whether the SPO occurs or not, during a period after the meta data is programmed in the meta area 111 before a subsequent write request is received from the host 300. Accordingly, when the program operation of the meta data is completed (S150), the controller 200 generates the program command for storing the state flag indicating the lock state in the state area 113 (S170). The "lock state" is a state indicating that the program operation of storing the meta data into the meta area 111 is normally completed without any interruption, i.e., that the SPO does not occur while the meta data is being programmed in the meta area 111.

After the state flag indicating the lock state is programmed in the state area 113, the state flag indicating the lock state is maintained as the last state flag unless another write request is received from the host 300. Thereafter, the SPO occurs, after the memory system 1000 is recovered, the controller 200 determines to perform the reclaim operation on the meta area 111 with reference to the last state flag programmed in the state area 113. When the last state flag programmed in the state area 113 indicates the lock state, the controller 200 determines not to perform the reclaim operation on the meta area 111.

That is, according to the method of operating the controller 200 according to an embodiment of the present disclosure, when the program of the meta data is completed in the meta area 111 of the semiconductor memory device 100 (S150: Yes), the semiconductor memory device 100 is controlled to program the state flag indicating the lock state in the state area 113. When the state flag last programmed in the state area 113 is the state flag indicating the lock state, the controller 200 does not reclaim the meta data stored in the meta area 111 when the memory system 1000 is turned on, i.e., during the boot up of the memory system 1000. Accordingly, an unnecessary reclaim operation on the meta area 111 may be omitted, and thus a life of at least one memory block included in the meta area 111 may be increased. Therefore, the life of the memory blocks included in the semiconductor memory device 100 may be increased.

Figure 9:
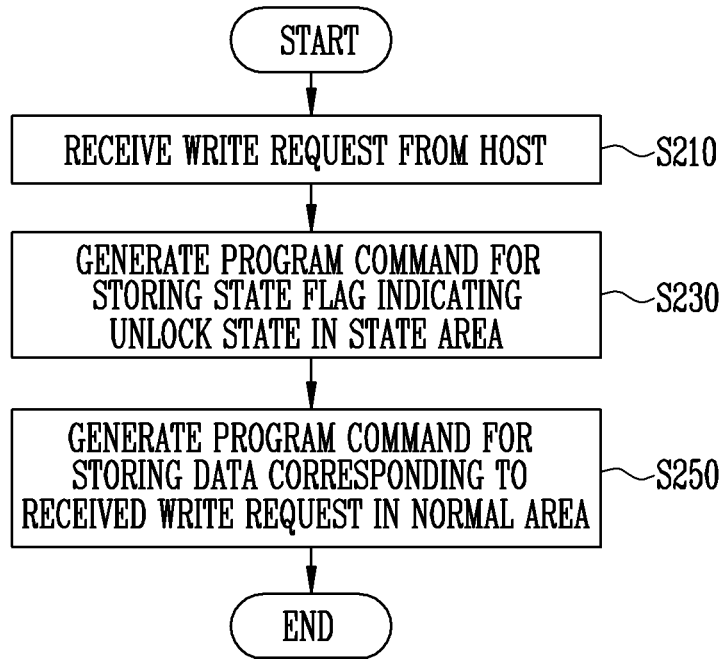
FIG. 9 is a flowchart illustrating a method of operating the controller 200 according to another embodiment of the present disclosure.

FIG. 9 is a flowchart illustrating a method of operating the controller 200 according to another embodiment of the present disclosure. More specifically, FIG. 9 is a flowchart illustrating an embodiment in which the state flag indicating the unlock state is stored in the state area 113.

Referring to FIG. 9, the method of operating the controller 200 according to another embodiment of the present disclosure includes receiving a write request from the host 300 (S210), generating a program command for storing the state flag indicating the unlock state in the state area 113, in response to the reception of the write request (S230), and generating a program command for storing data corresponding to the received write request in the normal areas 112*a* to 112*z* of the memory cell array 110 (S250).

In operation S210, the controller 200 may receive the write request and write data corresponding thereto from the host 300. The write data may be stored in the buffer memory 203.

In response to the write request from the host 300, the controller 200 may generate the program command for storing the state flag indicating the unlock state in the state area 113 (S230). In response to the program command generated in operation S230, the semiconductor memory device 100 may program the state flag indicating the unlock state in the state area 113 inside the memory cell array 110.

When receiving the write request from the host 300 (S210), the memory system may store the write data corresponding to the write request in the normal areas 112*a* to 112*z* of the semiconductor memory device 100. In addition, the meta data may be updated as the write data is stored, and the updated meta data may be stored in the meta area 111 inside the semiconductor memory device 100. That is, as the write request is received from the host 300, an operation of programming the meta data in the meta area 111 may be performed thereafter, and the SPO may occur while programming the meta data. Therefore, after receiving the write request from the host 300, a possibility that the meta data is incompletely programmed in the meta area 111 may not be excluded. Accordingly, when receiving the write request from the host (S210), the controller 200 according to an embodiment of the present disclosure preferentially generates the program command for storing the state flag indicating the unlock state in the state area 113 (S230). The "unlock state" is a state indicating that the meta data is not yet completely programmed into the meta area 111. Therefore, during a recovery operation after the SPO, the "unlock state" may indicate the possibility that the meta data is incompletely programmed in the meta area 111.

Thereafter, the controller 200 may generate the program command for storing the write data corresponding to the write request received from the host 300 in the normal areas 112*a* to 112*z* of the memory cell array 110 (S250). In response to the program command generated in operation S250, the semiconductor memory device 100 may program the write data received from the host in the normal areas 112*a* to 112*z* inside the memory cell array 110.

After performance of operation S250, the meta data may be programmed in the meta area 111. For example, the received write data may be programmed in the normal areas 112*a* to 112*z* inside the memory cell array 110, and the meta data corresponding thereto may be updated in a meta cache inside the buffer memory 203. The buffer memory 203 may include a plurality of areas. For example, the buffer memory 203 may include a write cache for storing the write data received from the host 300, a read cache for storing the read data received from the semiconductor memory device 100, the meta cache for storing the meta data, and the like. The controller 200 may store the updated meta data in the meta cache of the buffer memory 203 whenever the meta data is updated. When the meta cache is full of the meta data, the controller 200 may control the semiconductor memory device 100 to program the meta data of the meta cache to the meta area 111 of the memory cell array 110.

That is, when the meta cache is full of the meta data updated after operation S250 is performed, the controller 200 may generate the program command for programming the meta data of the meta cache in the meta area 111. After the semiconductor memory device 100 starts to program the meta data, which is stored in the meta cache inside the buffer memory 203, in the meta area 111, the SPO may occur before the corresponding program operation is completed. When the memory system 1000 is turned on again from the SPO, the controller 200 is required to perform the reclaim operation on the meta data stored in the meta area 111. This is because the power supply of the memory system 1000 is cut off during the program operation on the meta area 111, and the corresponding program operation is incompletely ended.

In this case, when the memory system 1000 is turned on again from the SPO, the controller 200 may check the last state flag stored in the state area 113. When the last state flag stored in the state area 113 indicates the unlock state, the controller 200 may perform the reclaim operation on the meta area 111.

Figure 10:
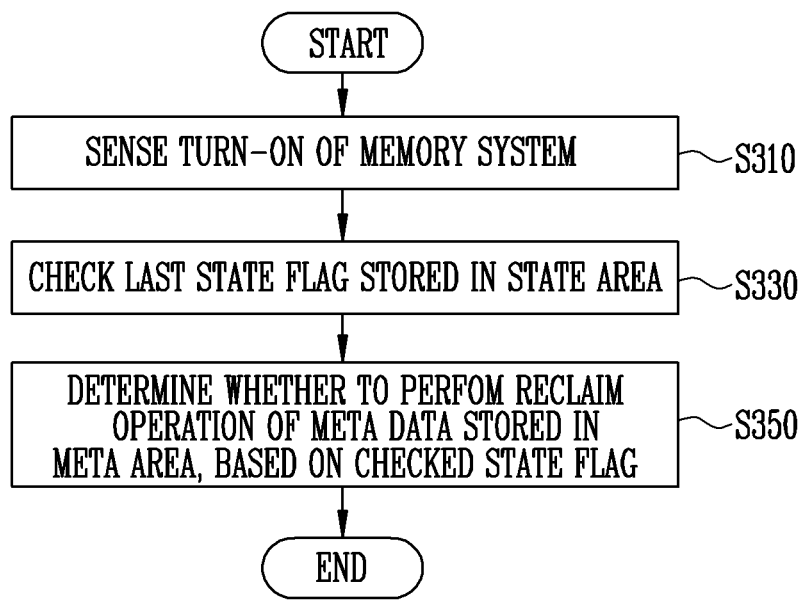
FIG. 10 is a flowchart illustrating a method of operating the controller 200 according to still another embodiment of the present disclosure.

FIG. 10 is a flowchart illustrating a method of operating the controller 200 according to still another embodiment of the present disclosure. More specifically, FIG. 10 is a flowchart illustrating an embodiment in which a recovery operation is performed when the memory system 1000 is turned on.

Referring to FIG. 10, the method of operating the controller 200 according to still another embodiment of the present disclosure includes sensing a turn-on of the memory system 1000 (S310), checking the last state flag stored in the state area 113 of the memory cell array 110 (S330), and determining whether to perform the reclaim operation of the meta data stored in the meta area 111 based on the checked state flag (S350).

When the memory system 1000 is switched from a turn-off state to a turn-on state, the controller 200 may sense the turn-on of the memory system 1000 (S310). As the memory system 1000 is turned on, the controller 200 checks the last stored state flag among at least one state flag stored in the state area 113 of the memory cell array 110 (S330). The last stored state flag may indicate a state of a meta block during an immediately before power cycle of the memory system 1000.

Therefore, the controller 200 determines whether to perform the reclaim operation of the meta data stored in the meta area 111, based on the checked state flag (S350). When the checked state flag indicates the lock state, this means that the meta data is wholly stored in the meta area 111 and the SPO does not occur during the program operation of the meta data. Therefore, in this case, the reclaim operation of the meta data stored in the meta area 111 is not performed in operation S350.

When the checked state flag indicates the unlock state, this means the possibility that the SPO occurs while the meta data is programmed in the meta area 111. Therefore, in this case, the reclaim operation on the meta data stored in the meta area 111 is performed in operation S350.

As described above, according to the method of operating the controller 200 according to still another embodiment of the present disclosure, it is determined whether to perform the reclaim operation on the meta area 111 based on the last state flag stored in the state area 113 when the memory system 1000 is turned on. Therefore, an unnecessary reclaim operation on the meta area 111 may be omitted. Accordingly, the life of the memory blocks included in the semiconductor memory device 100 may be increased.

FIG. 11 is a flowchart illustrating an embodiment of the present disclosure. More specifically, FIG. 11 is a flowchart illustrating an embodiment in which the methods shown in FIGS. 10 and 8 are combined.

Referring to FIG. 11, a method of operating the controller 200 according to an embodiment of the present disclosure includes sensing the turn-on of the memory system 1000 (S410), checking the last state flag stored in the state area 113 of the memory cell array 110 (S420), and determining whether the state flag is the lock state (S430). Steps S410 and S420 may correspond to steps S310 and S330 of FIG. 10, respectively.

According to the embodiment shown in FIG. 11, the method of operating the controller 200 according to an embodiment of the present disclosure may further include controlling the semiconductor memory device 100 to reclaim the meta data stored in the meta area 111 (S440), in response to a determination that the last state flag stored in the state area 113 is not the lock state (S430: No). When the last state flag stored in the state area 113 is the unlock state (S430: No), the reclaim operation on the meta area 111 may be required. Therefore, in this case, the controller 200 may control the semiconductor memory device 100 to reclaim the meta area 111. More specifically, in operation S440, the controller 200 may control the semiconductor memory device 100 to program the meta data, which is stored in a first area of the meta area 111, in a second area of the meta area 111.

When the last state flag stored in the state area 113 is the lock state (S430: Yes), the reclaim operation on the meta area 111 may not be required. Therefore, in this case, the controller 200 may omit operation S440 of reclaiming the meta area 111.

In addition, according to the embodiment shown in FIG. 11, the method of operating the controller 200 according to an embodiment of the present disclosure may further include controlling the semiconductor memory device 100 to perform a rebuild operation of the memory system and store the updated meta data in the meta area 111 (S450), and controlling the semiconductor memory device 100 to store the state flag indicating the lock state in the state area 113 (S460).

In operation S450, the rebuild operation on the memory system may be performed. The rebuild operation may include an operation of scanning the memory blocks included in the memory cell array 110 of the semiconductor memory device 100. In addition, the rebuild operation may include an operation of loading the meta data, which is stored in the meta area 111 of the semiconductor memory device 100, in the buffer memory 203 and updating the meta data based on a result of the scan operation of the memory block.

In operation S450, after the rebuild operation, the controller 200 may control the semiconductor memory device 100 to store the updated meta data in the meta area 111. Such an operation may correspond to operation S110 shown in FIG. 8.

When the operation of storing the meta data in the meta area 111 is completed, the controller 200 may control the semiconductor memory device 100 to store the state flag indicating the lock state in the state area 113 (S460). Operation S460 may be substantially the same as operation S170 of FIG. 8. Hereinafter, each of the operations shown in FIG. 11 is described with reference to FIGS. 12A and 12B.

Figure 12A:
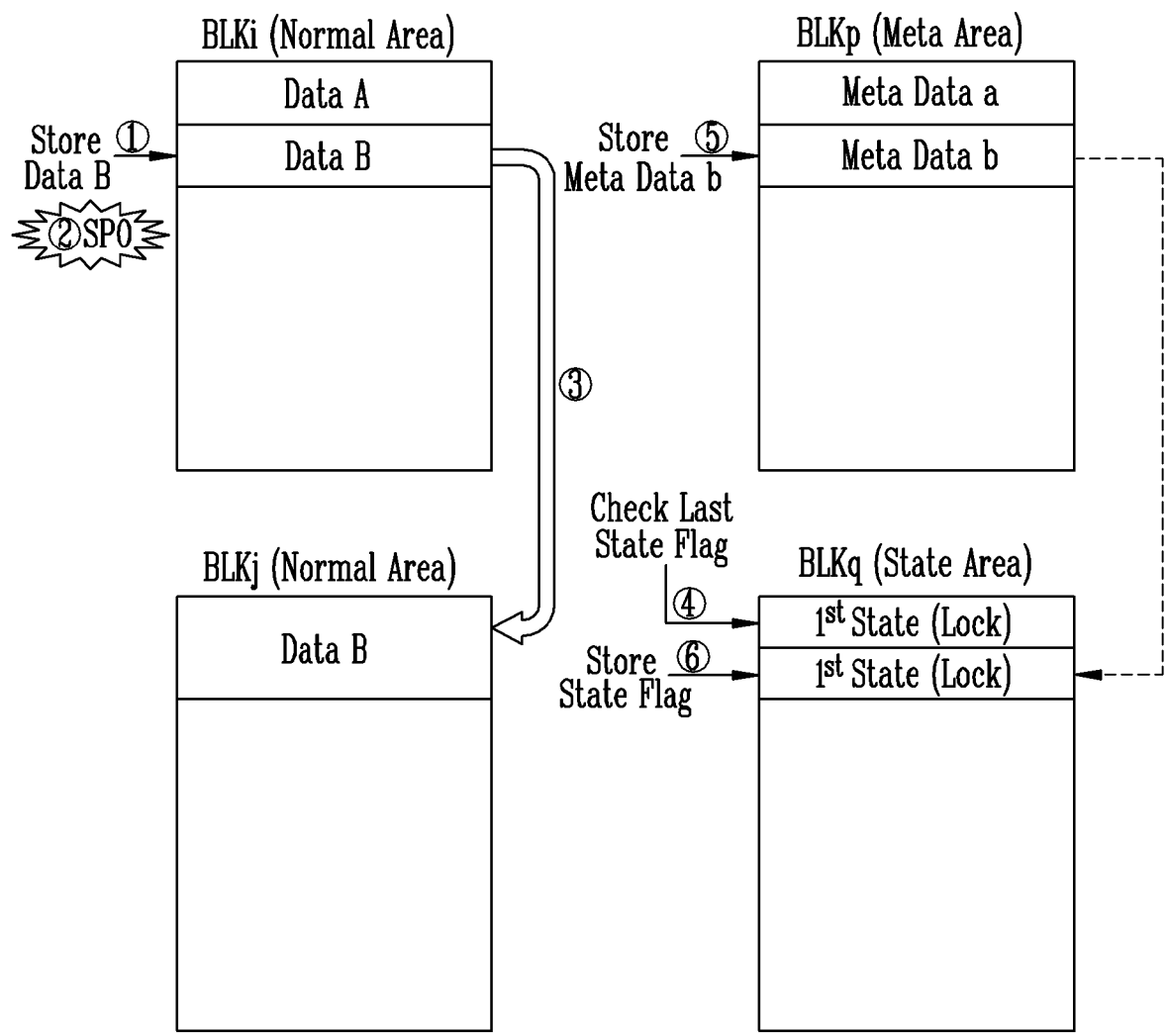

FIGS. 12A and 12B are diagrams illustrating the method shown in FIG. 11. More specifically, FIG. 12A is a diagram illustrating the operation of the controller 200 when the state flag is in the lock state in operation S430 of FIG. 11. In addition, FIG. 12B is a diagram illustrating the operation of the controller 200 when the state flag is in the unlock state in operation S430 of FIG. 11.

Referring to FIG. 12A, an i-th memory block BLKi and a j-th memory block BLKj are shown as memory blocks included in the normal areas 112a to 112z. In addition, a p-th memory block BLKp is shown as a memory block included in the meta area 111, and a q-th memory block BLKq is shown as a memory block included in the state area 113.

In an example of FIG. 12A, let us assume a situation that data A is stored in the i-th memory block BLKi, meta data a corresponding thereto is stored in the p-th memory block BLKp of the meta area, and the last state flag stored in the q-th memory block BLKq indicates $1^{st}$ state, i.e. "lock state." In this situation, let us further assume that data B is about to be stored in the i-th memory block BLKi (①). Before a program of the data B is completed, an SPO may occur (②). When the memory system 1000 is turned on again after the SPO, the data B partially incompletely programmed in the i-th memory block BLKi may be stored in the j-th memory block BLKj of the normal area (③). Thereafter, the method shown in FIG. 11 may be performed. The controller 200 senses the turn-on of the memory system 1000 according to operation S410 (S410), and checks the last state flag stored in the state area 113 (S420). Accordingly, the last state flag is checked in the q-th memory block BLKq (④). Referring to FIG. 12A, the last state flag is a flag indicating a first state, that is, the lock state (S430: Yes). In the example of FIG. 12A, the state flag may be stored in a page unit. For example, a data pattern indicating the first state, that is, the lock state, may be stored in one page as the state flag. To this end, the controller 200 may transfer the program command and the data pattern indicating the lock state to the semiconductor memory device 100. The semiconductor memory device 100 may program the data pattern indicating the lock state in a selected page inside a memory block corresponding to the state area.

Since the state flag indicates the first state, the reclaim operation on the meta data stored in the meta area 111, that is, the p-th memory block BLKp is not performed. Thereafter, the controller 200 controls the semiconductor memory device 100 to perform the rebuild operation and store the updated meta data, that is, meta data b corresponding to the data B, following the p-th memory block BLKp in which the existing meta data a is stored (⑤, S450). When the storage of the meta data b is completed, the state flag indicating the first state, that is, the lock state is stored in the q-th memory block BLKq corresponding to the state area (⑥, S460). Referring to FIG. 12A, when the memory system 1000 is turned on after the SPO, the reclaim operation on the meta data stored in the meta area may be omitted in a case where the last stored state flag indicates the lock state.

Referring to FIG. 12B, similarly to FIG. 12A, the i-th memory block BLKi and the j-th memory block BLKj are shown as the memory blocks included in the normal areas 112a to 112z. In addition, the p-th memory block BLKp is shown as the memory block included in the meta area 111, and the q-th memory block BLKq is shown as the memory block included in the state area 113. Additionally, an r-th memory block BLKr is shown as a memory block included in the meta area 111.

In an example of FIG. 12B, let us assume a situation that the data A is stored in the i-th memory block BLKi, the meta data a corresponding thereto is stored in the p-th memory block BLKp of the meta area, and the last state flag stored in the q-th memory block BLKq indicates $2^{nd}$ state, i.e. "unlock state." In this situation, let us further assumed that the data B is about to be stored in the i-th memory block BLKi (①). Before the program of the data B is completed, the SPO may occur (②). When the memory system 1000 is turned on again after the SPO, the data B partially incompletely programmed in the i-th memory block BLKi may be stored in the j-th memory block BLKj of the normal area (③). Thereafter, the method shown in FIG. 11 may be performed. The controller 200 senses the turn-on of the memory system 1000 according to operation S410 (S410), and checks the last state flag stored in the state area 113 (S420). Accordingly, the last state flag is checked in the q-th memory block BLKq (④). Referring to FIG. 12B, differently from FIG. 12A, the last state flag is a flag indicating a second state, that is, the unlock state (S430: No).

Referring to FIG. 12B, the last state flag is the flag indicating the second state, that is, the unlock state. In the example of FIG. 12B, the state flag may be stored in a page unit. For example, a data pattern indicating the second state, that is, the unlock state, may be stored in one page as the state flag. The data pattern indicating the unlock state may be different from the data pattern indicating the lock state. To this end, the controller 200 may transfer the program command and the data pattern indicating the unlock state to the semiconductor memory device 100. The semiconductor memory device 100 may program the data pattern indicating the unlock state in the selected page inside the memory block corresponding to the state area.

Accordingly, the reclaim operation on the meta data stored in the meta area 111, that is, the p-th memory block BLKp is performed. More specifically, the reclaim operation is performed in a method in which the meta data a stored in the p-th memory block BLKp is programmed in the r-th memory block BLKr (⑤).

Thereafter, the controller 200 controls the semiconductor memory device 100 to perform the rebuild operation and store the updated meta data, that is, the meta data b corresponding to the data B, following the r-th memory block BLKp (⑥, S450). When the storage of the meta data b is completed, the state flag indicating the first state, that is, the lock state is stored in the q-th memory block BLKq corresponding to the state area (⑦, S460). Referring to FIG. 12B, when the memory system 1000 is turned on after the SPO, the reclaim operation on the meta data stored in the meta area may be performed in a case where the last stored state flag indicates the unlock state.

FIG. 13 is a flowchart illustrating an embodiment of the present disclosure. More specifically, FIG. 13 is a flowchart illustrating an embodiment in which the methods shown in FIGS. 9 and 8 are combined.

Referring to FIG. 13, the method of operating the controller 200 according to an embodiment of the present disclosure includes receiving the write request from the host 300 (S510), controlling the semiconductor memory device 100 to store the state flag indicating the unlock state in the state area 113, in response to the reception of the write request (S520), and controlling the semiconductor memory device 100 to store the data corresponding to the received write request in the normal areas 112a to 112z of the memory cell array 110 (S530). Operations S510, S520, and S530 may correspond to operations S210, S230, and S250 of FIG. 9, respectively. That is, in operation S510, the controller 200 may receive the write request and the write data corresponding thereto from the host 300. The write data may be stored in the buffer memory 203. In addition, in operation S520, the controller 200 may generate the program command for storing the state flag indicating the unlock state in the state area 113. In step S530, the controller 200 may generate the program command for storing the write data corresponding to the write request received from the host 300 in the normal areas 112a to 112z inside the memory cell array 110. In response to the program command generated in operation S530, the semiconductor memory device 100 may program the write data received from the host in the normal areas 112a to 112z inside the memory cell array 110.

According to the embodiment shown in FIG. 13, the method of operating the controller 200 according to an embodiment of the present disclosure may further include updating the meta data corresponding to the data stored in the normal areas 112a to 112z (S540) and determining whether the meta cache of the buffer memory 203 is full of the meta data (S550). In operation S540, the updated meta data may be stored in the buffer memory 203. As described above, the meta data may be updated in the meta cache inside the buffer memory 203. The controller 200 may store the updated meta data in the meta cache of the buffer memory 203 whenever the meta data is updated.

The method of operating the controller 200 according to an embodiment of the present disclosure may further include controlling the semiconductor memory device 100 to store the meta data, which is stored in the meta cache, in the meta area 111 of the semiconductor memory device 100 (S560), when the meta cache is full of the meta data (S550: Yes), and controlling the semiconductor memory device 100 to store the state flag indicating the lock state in the state area (S570). Operations S560 and S570 may correspond to steps S110 and S170 of FIG. 8, respectively. Hereinafter, each of the operations shown in FIG. 13 is described with reference to FIG. 14.

Figure 14:
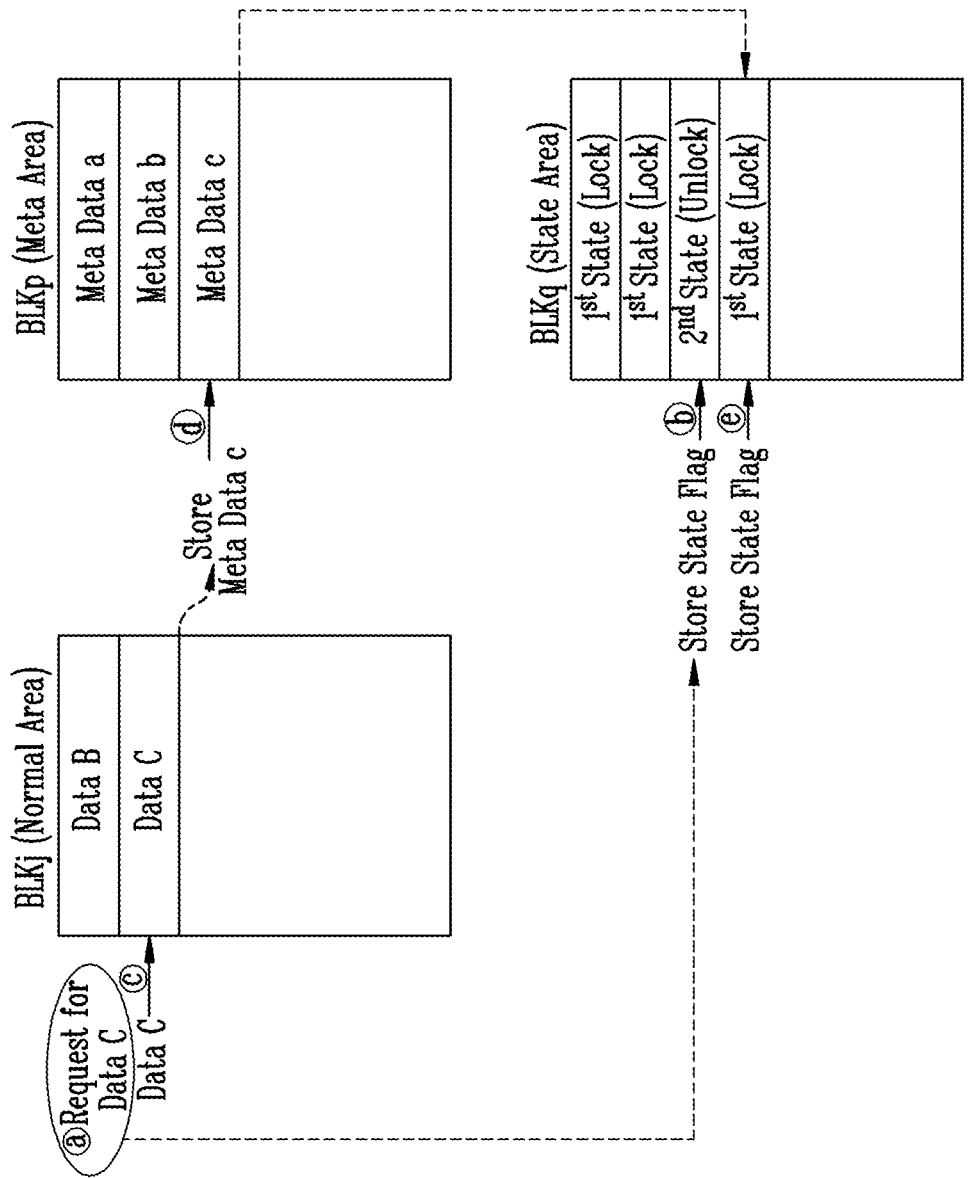
FIG. 14 is a diagram illustrating a method shown in FIG. 13.

FIG. 14 is a diagram illustrating the method shown in FIG. 13. More specifically, FIG. 14 illustrates an operation after the operation shown in FIG. 12A is performed.

Referring to FIG. 14, the j-th memory block BLKj is shown as the memory block included in the normal areas 112a to 112z. In addition, the p-th memory block BLKp is shown as the memory block included in the meta area 111, and the q-th memory block BLKq is shown as the memory block included in the state area 113. As a result of performing the operations shown in FIG. 12A, the data B is stored in the j-th memory block BLKj, and the meta data a and the meta data b are stored in the p-th memory block BLKp. The last state flag stored in the q-th memory block BLKq indicates the first state, that is, the lock state.

In an example of FIG. 14, in a state in which the data B is stored in the j-th memory block BLKi, the controller 200 may receive a write request for data C from the host 300 (ⓐ, S510). Accordingly, the controller 200 stores the state flag indicating the second state, that is, the unlock state, in the q-th memory block BLKq which is the state area (ⓑ, S520). In addition, the controller 200 may store the data C received from the host 300 in the j-th memory block BLKj (ⓒ, S530).

As the data C is newly stored in the semiconductor memory device 100, the meta data may be updated (S540). When the meta cache of the buffer memory 203 is full of the meta data due to the update of the meta data (S550: Yes), the controller 200 controls the semiconductor memory device 100 to store meta data c, which is stored in the meta cache, in the p-th memory block BLKp (ⓓ, S560). When the storage of the meta data c is completed, the state flag indicating the first state, that is, the lock state, is stored in the q-th memory block BLKq corresponding to the state area (ⓔ, S570).

Figure 15:
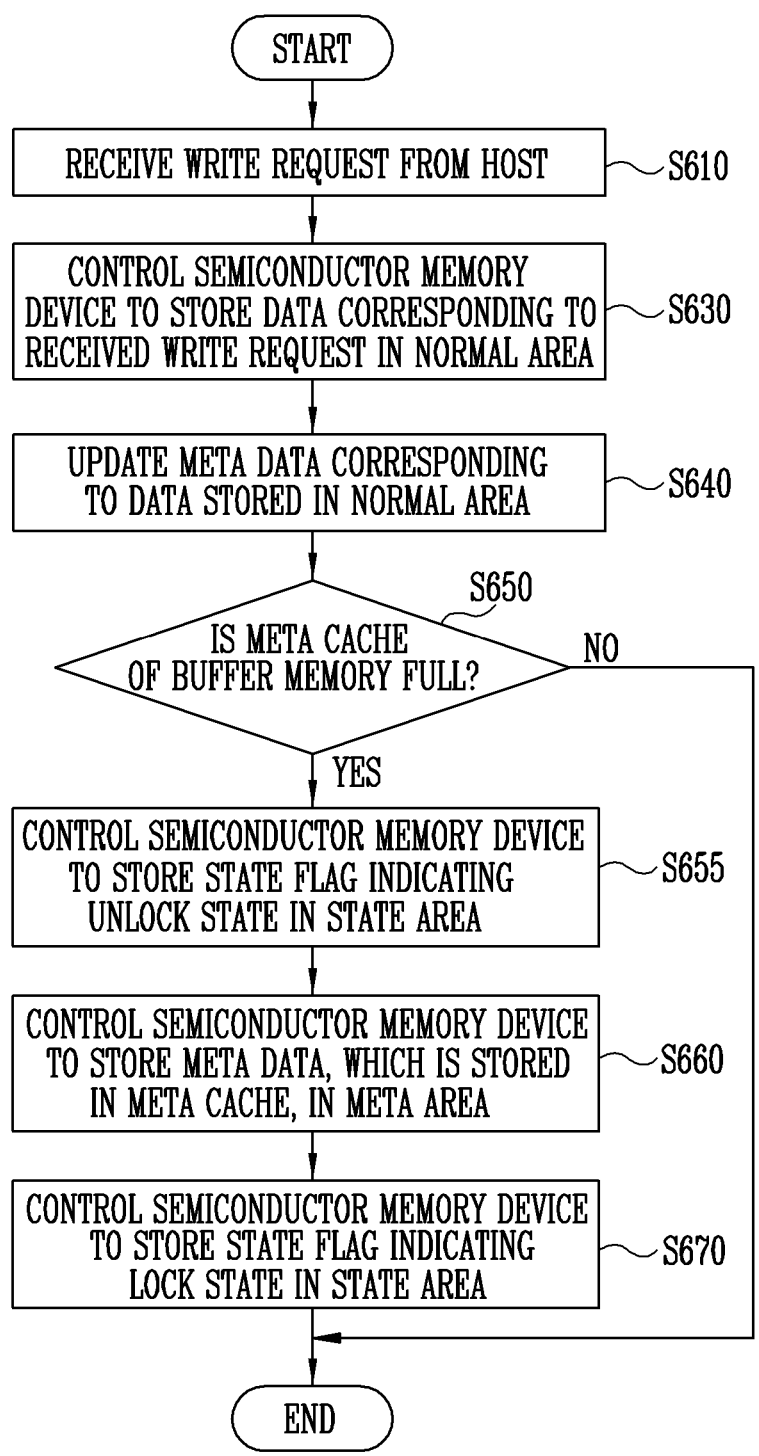
FIG. 15 is a flowchart illustrating an embodiment of the present disclosure.

FIG. 15 is a flowchart illustrating an embodiment of the present disclosure. More specifically, FIG. 15 is a flowchart illustrating a modified embodiment of FIG. 13.

Referring to FIG. 15, the method of operating the controller 200 according to an embodiment of the present disclosure may further include receiving the write request from the host 300 (S610), controlling the semiconductor memory device 100 to store the data corresponding to the received write request in the normal areas 112a to 112z of the memory cell array 110 (S630), updating the meta data corresponding to the data stored in the normal areas 112a to 112z (S640), determining whether the meta cache of the buffer memory 203 is full of the meta data (S650), when the meta cache of the buffer memory 203 is full of the meta data (S650: Yes), controlling the semiconductor memory device 100 to store the state flag indicating the unlock state in the state area 113 (S655), controlling the semiconductor memory device 100 to store the meta data, which is stored in the meta cache, in the meta area 111 of the semiconductor memory device 100 (S660), and controlling the semiconductor memory device 100 to store the state flag indicating the lock state in the state area (S670). Operations S610, S630, S640, S650, S660, and S670 may correspond to operations S510, S530, S540, S550, S560, and S570 of FIG. 13, respectively. In a case of the embodiment shown in FIG. 13, storing the state flag indicating the unlock state in the state area (S520) is performed immediately after receiving the write request from the host (S510), but in a case of the embodiment shown in FIG. 15, storing the state flag indicating the unlock state in the state area (S655) is performed immediately after determining that the meta cache of the buffer memory 203 is full of the meta data (S650: Yes). Hereinafter, each of the operations shown in FIG. 15 is described with reference to FIG. 16.

Figure 16:
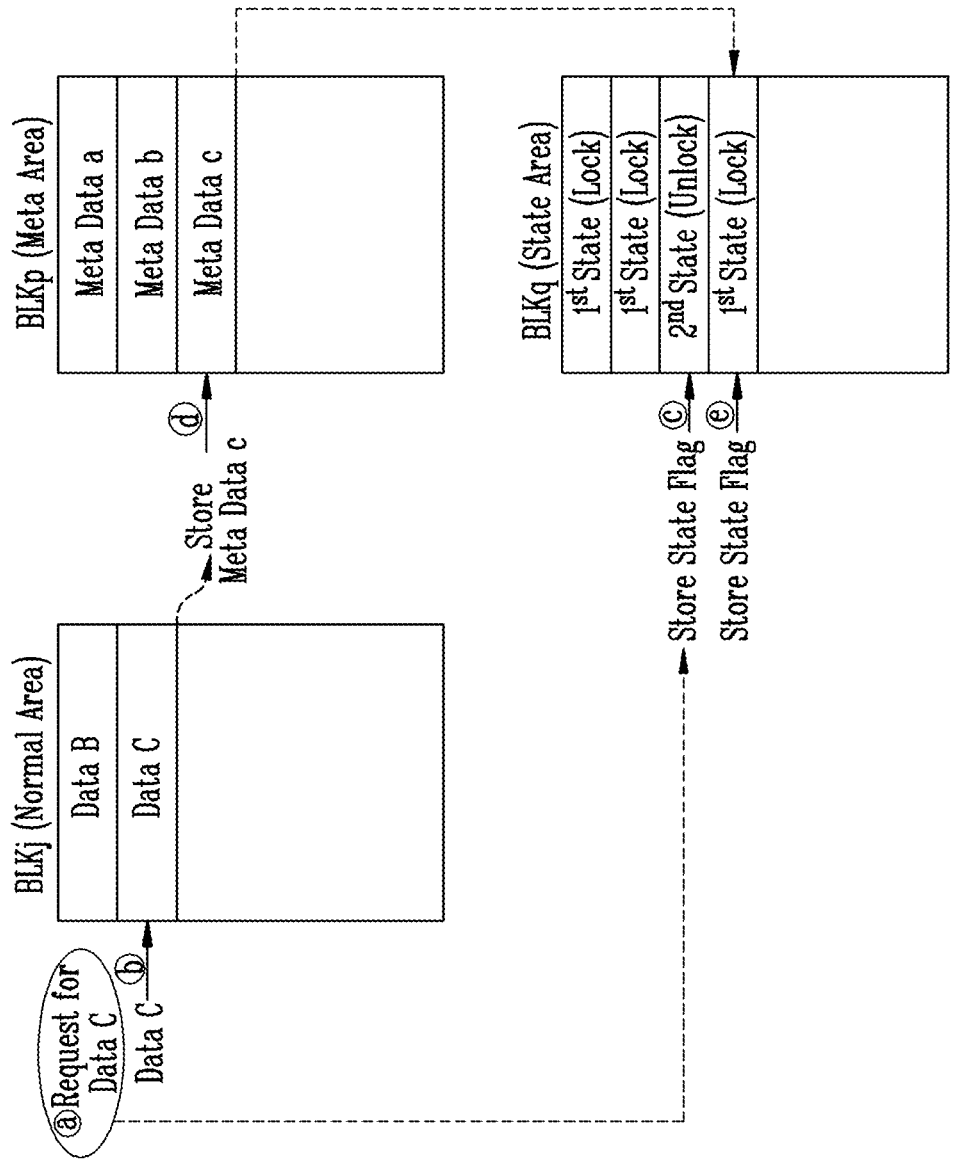
FIG. 16 is a diagram illustrating a method shown in FIG. 15.

FIG. 16 is a diagram illustrating the method shown in FIG. 15. More specifically, FIG. 16 illustrates an operation after the operation shown in FIG. 12A is performed.

Referring to FIG. 16, the j-th memory block BLKj is shown as the memory block included in the normal areas 112a to 112z. In addition, the p-th memory block BLKp is shown as the memory block included in the meta area 111, and the q-th memory block BLKq is shown as the memory block included in the state area 113. As a result of performing the operations shown in FIG. 12A, the data B is stored in the j-th memory block BLKj, and the meta data a and the meta data b are stored in the p-th memory block BLKp. The last state flag stored in the q-th memory block BLKq indicates the first state, that is, the lock state.

In an example of FIG. 16, in a state in which the data B is stored in the j-th memory block BLKi, the controller 200 may receive the write request for the data C from the host 300 (ⓐ, S610). The controller 200 may store the data C received from the host 300 in the j-th memory block BLKj, in response to the received write request (ⓑ, S630).

As the data C is newly stored in the semiconductor memory device 100, the meta data may be updated (S640). When the meta cache of the buffer memory 203 is full of the meta data due to the update of the meta data (S650: Yes), the controller 200 stores the state flag indicating the second state, that is, the unlock state in the q-th memory block BLKq which is the state area (ⓒ, S655).

Thereafter, the controller 200 controls the semiconductor memory device 100 to store the meta data c, which is stored in the meta cache, in the p-th memory block BLKp (ⓓ, S660). When the storage of the meta data c is completed, the state flag indicating the first state, that is, the lock state, is stored in the q-th memory block BLKq corresponding to the state area (ⓔ, S670).

That is, differently from the embodiment shown in FIG. 14, in the embodiment of FIG. 16, when it is determined that the meta cache of the buffer memory 203 is full of the meta data, the controller 200 controls the semiconductor memory device 100 to store the state flag indicating the unlock state in the q-th memory block BLKq which is the state area.

Figure 17:
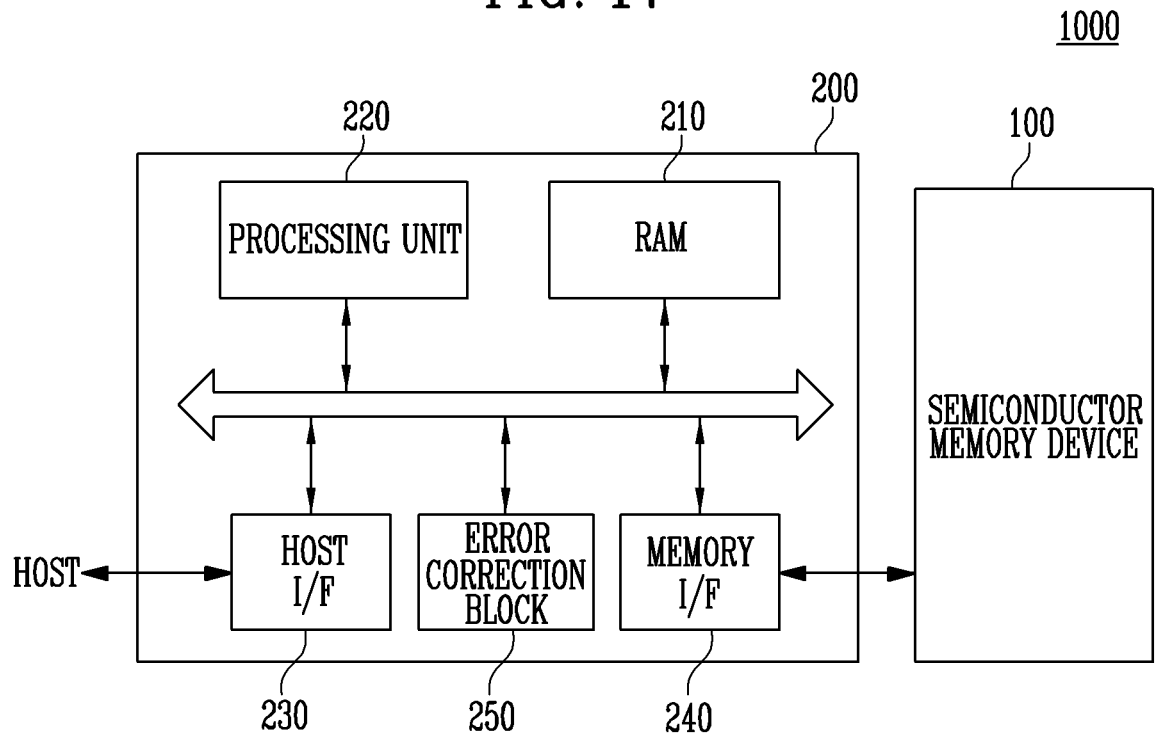
FIG. 17 is a block diagram illustrating an example of the controller shown in FIG. 1.

FIG. 17 is a block diagram illustrating an example of the controller shown in FIG. 1.

Referring to FIG. 17, the controller 200 is connected to the semiconductor memory device 100 and a host HOST. The semiconductor memory device 100 may be the semiconductor memory device described with reference to FIG. 2. The controller 200 corresponds to the controller 200 of FIG. 1 or 7. Hereinafter, a repetitive description is omitted.

The controller 200 is configured to access the semiconductor memory device 100 in response to a request from the host HOST. For example, the controller 200 is configured to control read, write, erase, and background operations of the semiconductor memory device 100. The controller 200 is configured to provide an interface between the semiconductor memory device 100 and the host HOST. The controller 200 is configured to drive firmware for controlling the semiconductor memory device 100.

The controller 200 includes a random access memory (RAM) 210, a processing unit 220, a host interface 230, a memory interface 240, and an error correction block 250. The RAM 210 is used as at least one of an operation memory of the processing unit 220, a cache memory between the semiconductor memory device 100 and the host HOST, and a buffer memory between the semiconductor memory device 100 and the host HOST. The RAM 210 of FIG. 17 may be substantially the same as the buffer memory 203 of FIG. 7.

The processing unit 220 controls an overall operation of the controller 200. The processing unit 220 of FIG. 17 may be substantially the same component as the processing unit 201 of FIG. 7.

The host interface 230 includes a protocol for performing data exchange between the host HOST and the controller 200. In an embodiment, the controller 200 is configured to communicate with the host HOST through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol. The host interface 230 of FIG. 17 may be substantially the same as the host interface 205 of FIG. 7.

The memory interface 240 interfaces with the semiconductor memory device 100. For example, the memory interface 1240 includes a NAND interface or a NOR interface. The memory interface 240 of FIG. 17 may be substantially the same as the memory interface 207 of FIG. 7.

The error correction block 250 is configured to detect and correct an error of data received from the semiconductor memory device 100 using an error correcting code (ECC). The processing unit 220 may control the semiconductor memory device 100 to adjust a read voltage and perform re-read according to an error detection result of the error correction block 250. In an embodiment, the error correction block may be provided as a component of the controller 200.

The controller 200 and the semiconductor memory device 100 may be integrated into one semiconductor device. In an embodiment, the controller 200 and the semiconductor memory device 100 may be integrated into one semiconductor device to form a memory card. For example, the controller 200 and the semiconductor memory device 100 may be integrated into one semiconductor device to form a memory card such as a PC card (personal computer memory card international association (PCMCIA)), a compact flash (CF) card, a smart media card (SM or SMC), a memory stick, a multimedia card (MMC, RS-MMC, or MMCmicro), an SD (SD, miniSD, microSD, or SDHC) card, and a universal flash storage (UFS).

The controller 200 and the semiconductor memory device 100 may be integrated into one semiconductor device to form a semiconductor drive (solid state drive (SSD)). The semiconductor drive (SSD) includes the memory system 1000 configured to store data in a semiconductor memory. When the memory system 1000 including the controller 200 and the semiconductor memory device 100 is used as the semiconductor drive (SSD), an operation speed of the host connected to the memory system 1000 is dramatically improved.

As another example, the memory system 1000 including the controller 200 and the semiconductor memory device 100 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 100 or the memory system including the same may be mounted as a package of various types. For example, the semiconductor memory device 100 or the memory system may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 18:
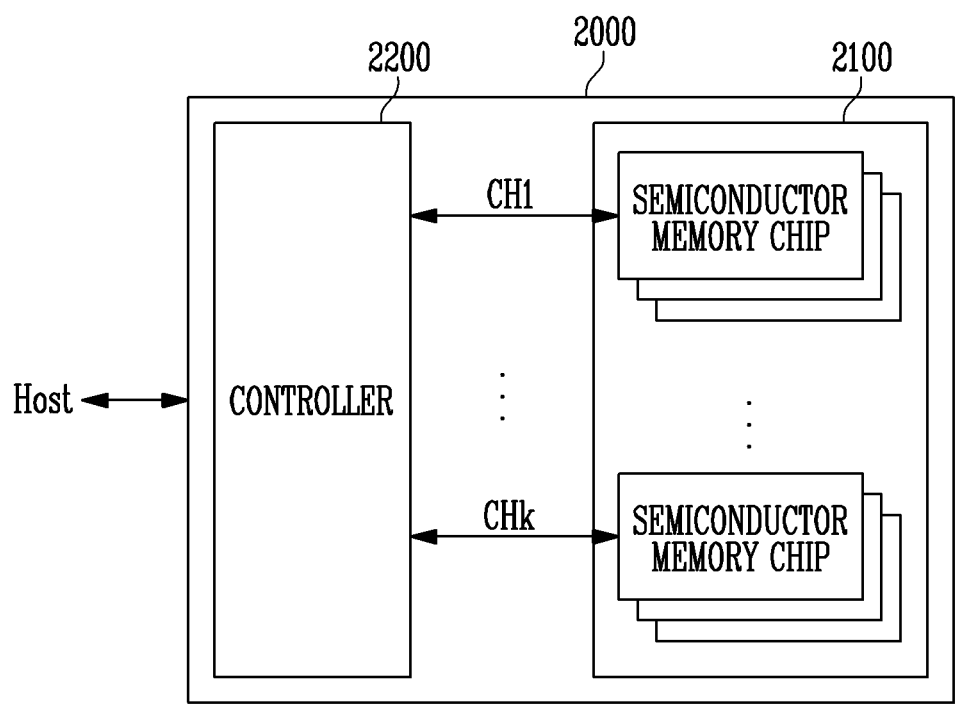
FIG. 18 is a block diagram illustrating an application example of the memory system of FIG. 1.

FIG. 18 is a block diagram illustrating an application example of the memory system of FIG. 1.

Referring to FIG. 18, the memory system 2000 includes a semiconductor memory device 2100 and a controller 2200.

The semiconductor memory device 2100 includes a plurality of semiconductor memory chips. The plurality of semiconductor memory chips are divided into a plurality of groups.

In FIG. 18, the plurality of groups communicate with the controller 2200 through first to k-th channels CH1 to CHk, respectively. Each semiconductor memory chip is configured and is operated similarly to that of the semiconductor memory device 100 described with reference to FIG. 2.

Each group is configured to communicate with the controller 2200 through one common channel. The controller 2200 is configured similarly to the controller 200 described with reference to FIG. 17 and is configured to control the plurality of memory chips of the semiconductor memory device 2100 through the plurality of channels CH1 to CHk.

Figure 19:
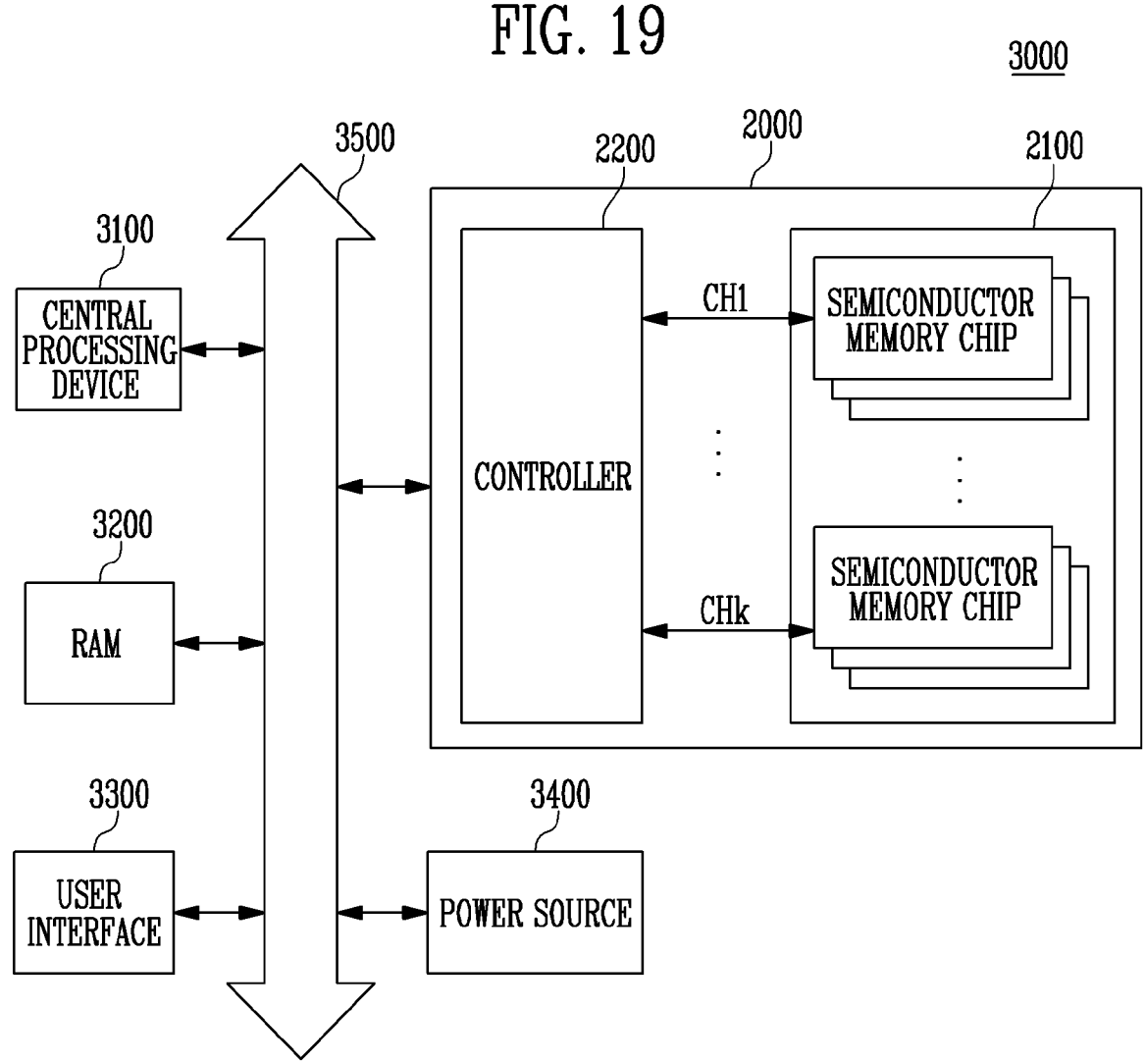
FIG. 19 is a block diagram illustrating a computing system including the memory system described with reference to FIG. 18.

FIG. 19 is a block diagram illustrating a computing system including the memory system described with reference to FIG. 18.

The computing system 3000 includes a central processing device 3100, a random access memory (RAM) 3200, a user interface 3300, a power source 3400, a system bus 3500, and the memory system 2000.

The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

In FIG. 19, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing device 3100 and the RAM 3200.

In FIG. 19, the memory system 2000 described with reference to FIG. 18 is provided. However, the memory system 2000 may be replaced with the memory system including the controller 200 and the semiconductor memory device 100 described with reference to FIG. 17.

The embodiments of the present disclosure disclosed in the present specification and drawings are merely provided as specific examples to easily describe the technical content of the present disclosure and to help understanding of the present disclosure, and are not intended to limit the scope of the present disclosure. It should be apparent to those of ordinary skill in the art that other modified examples based on the technical spirit of the present disclosure may be implemented in addition to the embodiments disclosed herein.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the appended claims.

What is claimed is:

1. A method of operating a controller that controls an operation of a semiconductor memory device including a meta area, a normal area, and a state area, the method comprising:

when a memory system including the controller and the semiconductor memory device is turned-on, generating a program command for storing, in the meta area, meta data stored in a meta cache in a memory buffer;

controlling the semiconductor memory device to program a state flag in the state area;

after a one power cycle of the memory system, sensing a turn-on of the memory system including the controller;

checking a last state flag among at least one or more state flags stored in the state area; and determining whether to perform a reclaim operation on the meta data stored in the meta area based on the checked state flag, wherein the last state flag in the state area is a flag to be used after the one power cycle after the last state flag is stored in the state area, wherein each of the at least one or more state flags stored in the state area indicates at least one of a first state that is a lock state of the meta area or a second state that is an unlock state of the meta area, wherein the lock state indicates a sudden power off (SPO) does not occur while programming the meta data in the meta area so that the meta data of the meta area is normally stored, and wherein the unlock state indicates the sudden power off (SPO) occurs while programming the meta data in the meta area so that the meta data of the meta area is not normally stored.

2. The method of claim 1, wherein the meta area includes a first memory block in which first meta data is stored and a second memory block of an erase state, and wherein the determining of whether to perform the reclaim operation on the meta data stored in the meta area based on the checked state flag comprises controlling the semiconductor memory device to perform the reclaim operation on the first meta data stored in the first memory block in response to a result of the checking indicating that the last state flag indicates the second state.

3. The method of claim 2, wherein the controlling of the semiconductor memory device to perform the reclaim operation on the first meta data stored in the first memory block comprises:

controlling the semiconductor memory device to read the first meta data stored in the first memory block; and controlling the semiconductor memory device to store the read first meta data in the second memory block.

4. The method of claim 3, wherein the determining of whether to perform the reclaim operation on the meta data stored in the meta area based on the checked state further comprises, after the controlling of the semiconductor memory device to perform the reclaim operation on the first meta data stored in the meta area:

updating second meta data stored in a buffer memory inside the controller;

controlling the semiconductor memory device to store the updated second meta data in the second memory block; and controlling the semiconductor memory device to store the state flag indicating the first state in the state area.

5. The method of claim 1, wherein the meta area includes a first memory block in which the first meta data is stored and a second memory block of an erase state, and wherein the determining of whether to perform the reclaim operation on the meta data stored in the meta area based on the checked state flag comprises:

updating second meta data stored in a buffer memory inside the controller in response to a result of the checking indicating that the last state flag indicates the first state;

controlling the semiconductor memory device to store the updated second meta data in the first memory block; and controlling the semiconductor memory device to store the state flag indicating the first state in the state area.

6. A memory system comprising:

a memory device including a first storage region, a second storage region and a third storage region; and a controller configured to control the memory device to:

store, into the third storage region, a first flag while storing a requested data piece and a meta data piece related to the requested data piece respectively into the first storage region and the second storage region;

store, into the third storage region, a second flag upon completion of the storing of the requested data piece and the related meta data piece; and perform, during boot-up of the memory system right after a sudden power interruption on the memory system, a recovery operation on the first storage region, the second storage region and the third storage region;

wherein the recovery operation includes:

a reclaim operation on the second storage region when the first flag is a flag stored last in the third storage region at the sudden power interruption of the memory system, and an operation of storing, into the third storage region, the second flag upon completion of the reclaim operation, and wherein the first flag and the second flag are flags to be used after the boot-up of the system right after the sudden power interruption on the memory system.

* * * * *